(12) United States Patent
Pisharodi

(10) Patent No.: US 11,493,024 B2
(45) Date of Patent: Nov. 8, 2022

(54) MULTIMODAL RENEWABLE ENERGY

(71) Applicant: Madhavan Pisharodi, Brownsville, TX (US)

(72) Inventor: Madhavan Pisharodi, Brownsville, TX (US)

(*) Notice: Subject to any disclaimer, the term of this patent is extended or adjusted under 35 U.S.C. 154(b) by 0 days.

(21) Appl. No.: 17/355,170

(22) Filed: Jun. 22, 2021

(65) Prior Publication Data
US 2022/0074388 A1  Mar. 10, 2022

Related U.S. Application Data

(62) Division of application No. 16/923,905, filed on Jul. 8, 2020, now Pat. No. 11,053,920.
(Continued)

(51) Int. Cl.
| | |
|---|---|
| *F03D 9/00* | (2016.01) |
| *B60K 17/22* | (2006.01) |
| *H02K 7/18* | (2006.01) |
| *H02K 7/00* | (2006.01) |
| *F03D 9/25* | (2016.01) |
| *H02S 10/20* | (2014.01) |
| *H02S 10/40* | (2014.01) |
| *F03D 9/32* | (2016.01) |

(Continued)

(52) U.S. Cl.
CPC .............. *F03D 9/007* (2013.01); *B60K 17/22* (2013.01); *F03D 9/008* (2013.01); *F03D 9/25* (2016.05); *F03D 9/32* (2016.05); *F03D 13/25* (2016.05); *H02K 7/003* (2013.01); *H02K 7/116* (2013.01); *H02K 7/183* (2013.01); *H02S 10/12* (2014.12); *H02S 10/20* (2014.12); *H02S 10/40* (2014.12)

(58) Field of Classification Search
CPC .. B60K 17/22; F03D 9/25; F03D 9/32; H02K 7/003; H02S 10/20
USPC ........................................................ 290/49, 50
See application file for complete search history.

(56) References Cited

U.S. PATENT DOCUMENTS

| | | | |
|---|---|---|---|
| 4,476,950 A | * | 10/1984 | Welschof ............... B60G 15/00 464/169 |
| 8,469,123 B1 | | 6/2013 | Kickerbocket |
| 8,853,869 B2 | | 10/2014 | Nikolic |

(Continued)

FOREIGN PATENT DOCUMENTS

| | | | | |
|---|---|---|---|---|
| DE | 102010038654 A1 | * | 2/2012 | ............... F03D 9/32 |
| GB | 2160620 A | * | 12/1985 | ............. B60K 17/22 |

(Continued)

*Primary Examiner* — Charles Reid, Jr.
(74) *Attorney, Agent, or Firm* — D'Ambrosio & Menon, PLLC; Usha Menon

(57) ABSTRACT

Methods and systems for substantially continual electrical power generation for a moving vehicle are disclosed herein. According to the various embodiments discussed herein, the battery range can be increased significantly using a variety of energy sources. The energy sources are configured to facilitate continual electricity generation based on: (i) one or more generators positioned around predetermined vehicle parts; (ii) wind energy created by the motion of the vehicle in relation to the surrounding medium, and (iii) solar energy. The system for continual electrical power generation in a moving vehicle has a generator having a coil-and-magnet arrangement around one or more vehicle components/modified components. The system further has an energy generator for converting solar energy and wind energy into electricity.

15 Claims, 23 Drawing Sheets

Related U.S. Application Data

(60) Provisional application No. 62/875,785, filed on Jul. 18, 2019.

(51) Int. Cl.
    *H02S 10/12*     (2014.01)
    *F03D 13/25*     (2016.01)
    *H02K 7/116*     (2006.01)

(56) References Cited

U.S. PATENT DOCUMENTS

| | | | |
|---|---|---|---|
| 9,287,428 B2 | 3/2016 | Pisharodi | |
| 10,079,571 B2 | 9/2018 | Pisharodi | |
| 10,097,135 B2 | 10/2018 | Pisharodi | |
| 10,439,552 B2 | 10/2019 | Pisharodi | |
| 2001/0008191 A1 | 7/2001 | Smith et al. | |
| 2007/0107957 A1* | 5/2007 | Lehrer | B60W 20/00 180/65.245 |
| 2008/0011531 A1* | 1/2008 | Cole | H02K 21/16 180/65.51 |
| 2009/0267348 A1* | 10/2009 | Liebermann | B60L 50/60 290/45 |
| 2009/0294188 A1* | 12/2009 | Cole | B60K 1/00 180/65.1 |
| 2010/0270810 A1* | 10/2010 | Liebermann | B60L 53/65 290/1 A |
| 2012/0049524 A1* | 3/2012 | Nikolic | B60L 53/00 290/50 |
| 2013/0261865 A1 | 10/2013 | Toki | |
| 2015/0014991 A1* | 1/2015 | Al Jaeedi | B60L 50/15 290/50 |
| 2017/0137028 A1 | 5/2017 | Amigo | |

FOREIGN PATENT DOCUMENTS

| | | | |
|---|---|---|---|
| JP | 2014070675 A | 4/2014 | |
| WO | WO-2010123629 A1 * | 10/2010 | B60L 7/10 |

* cited by examiner

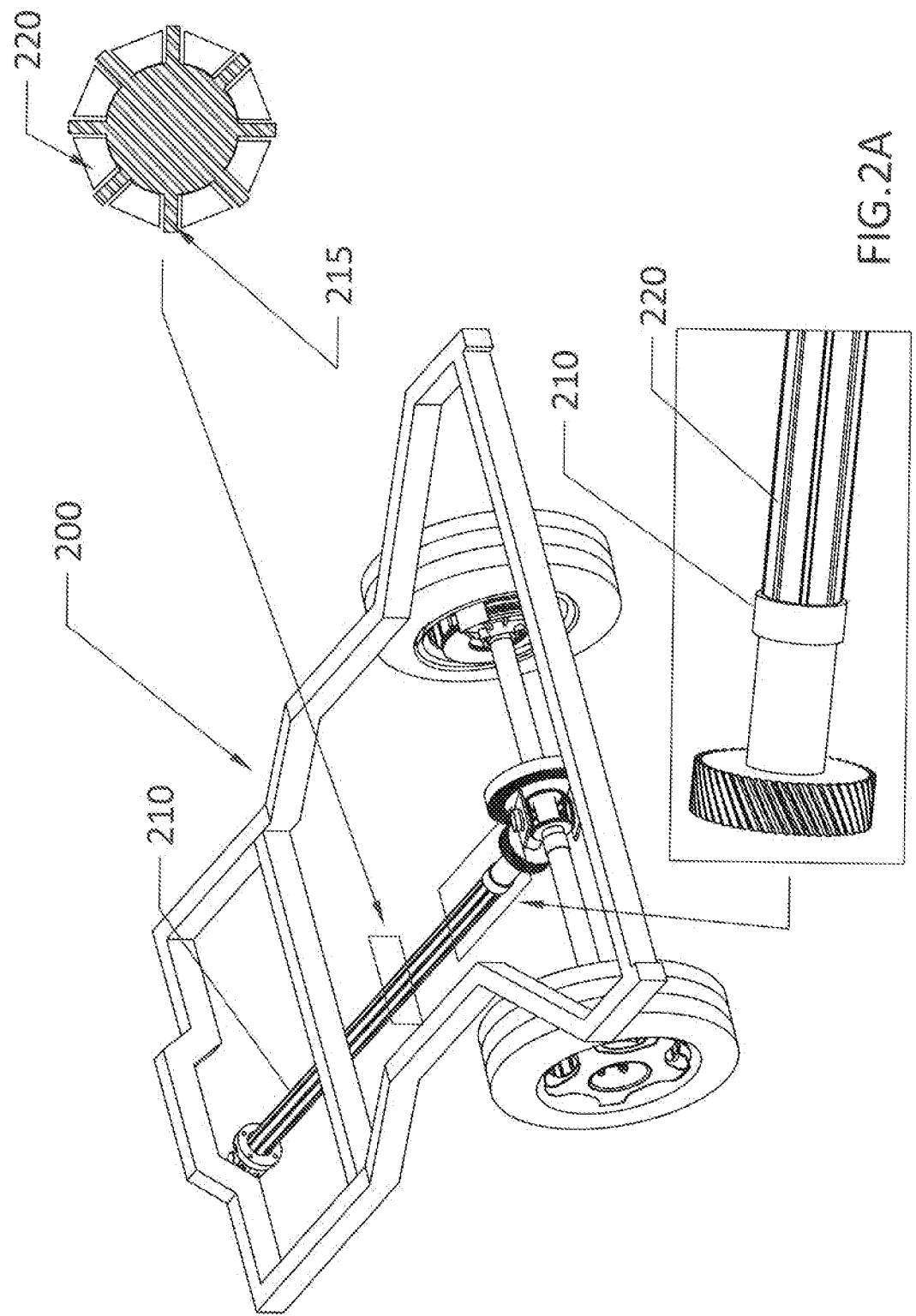

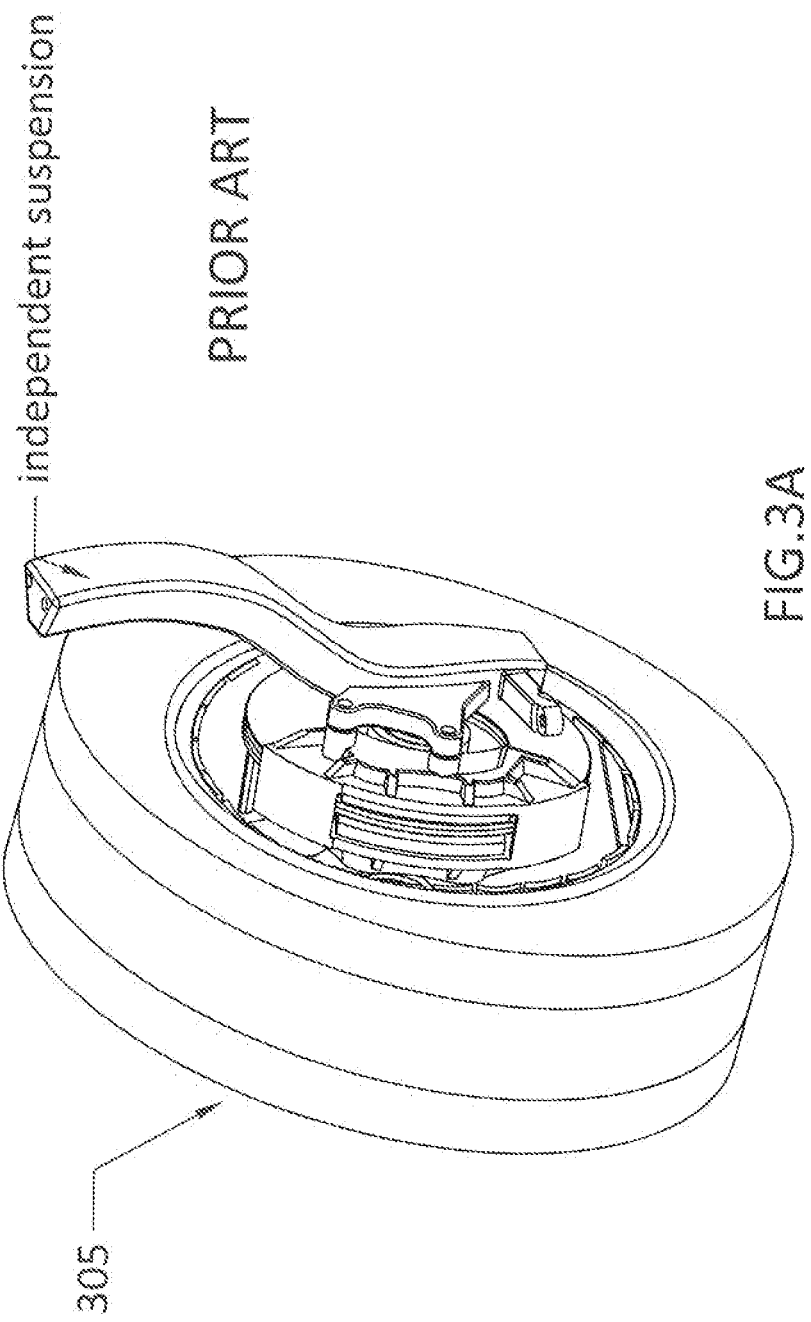

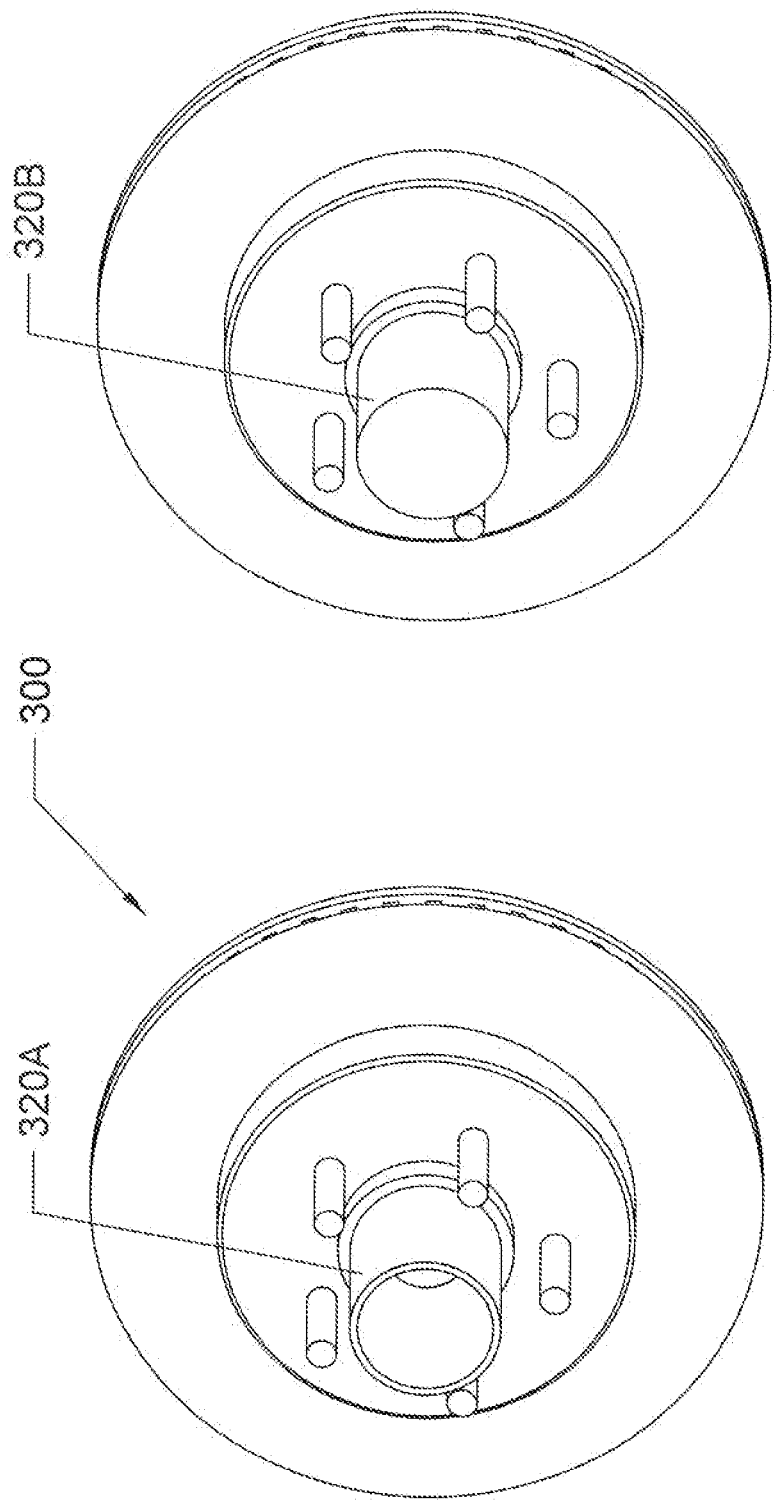

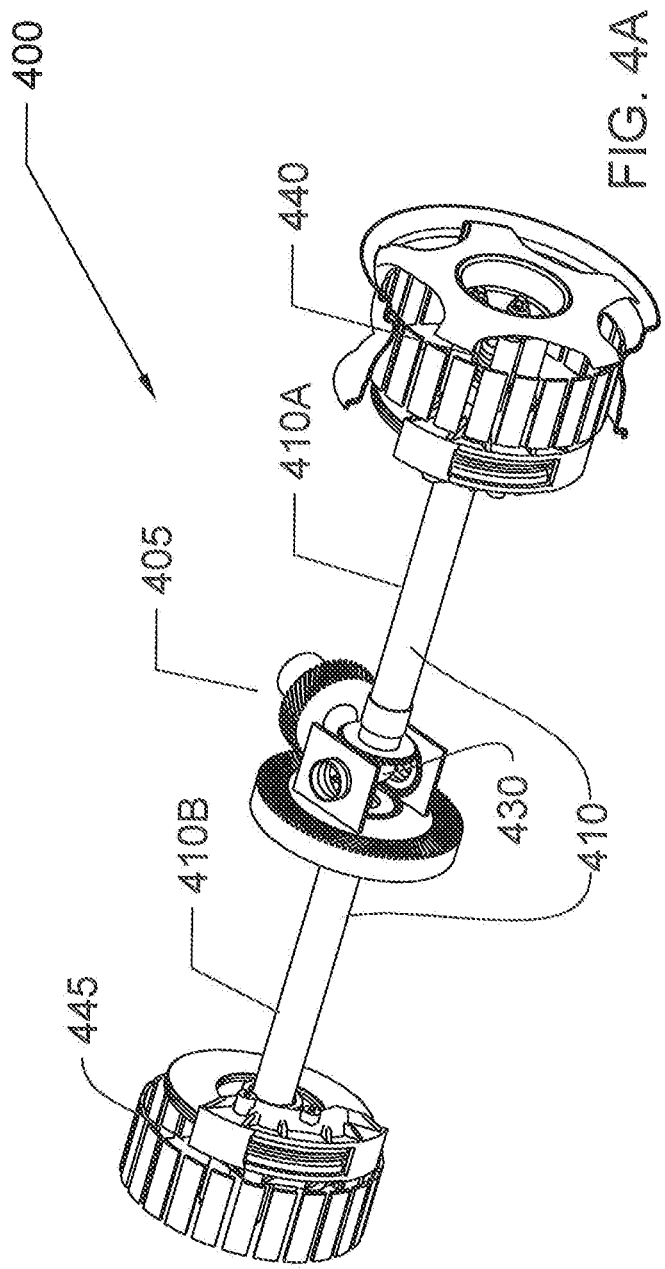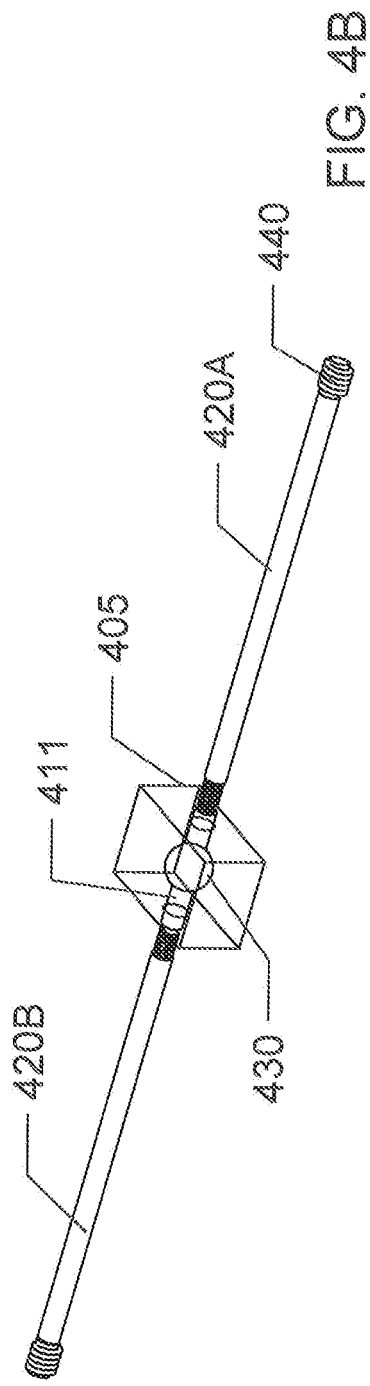

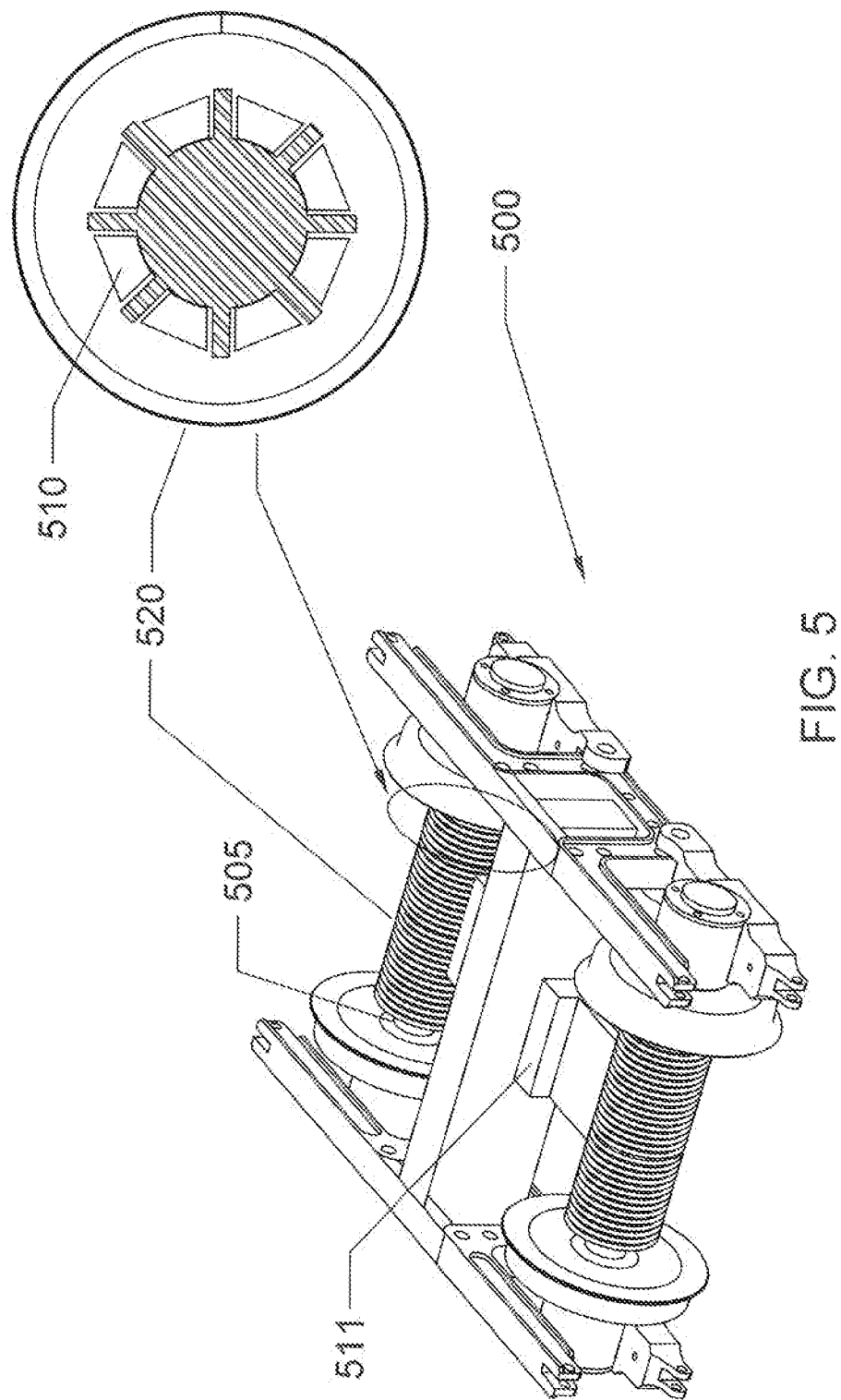

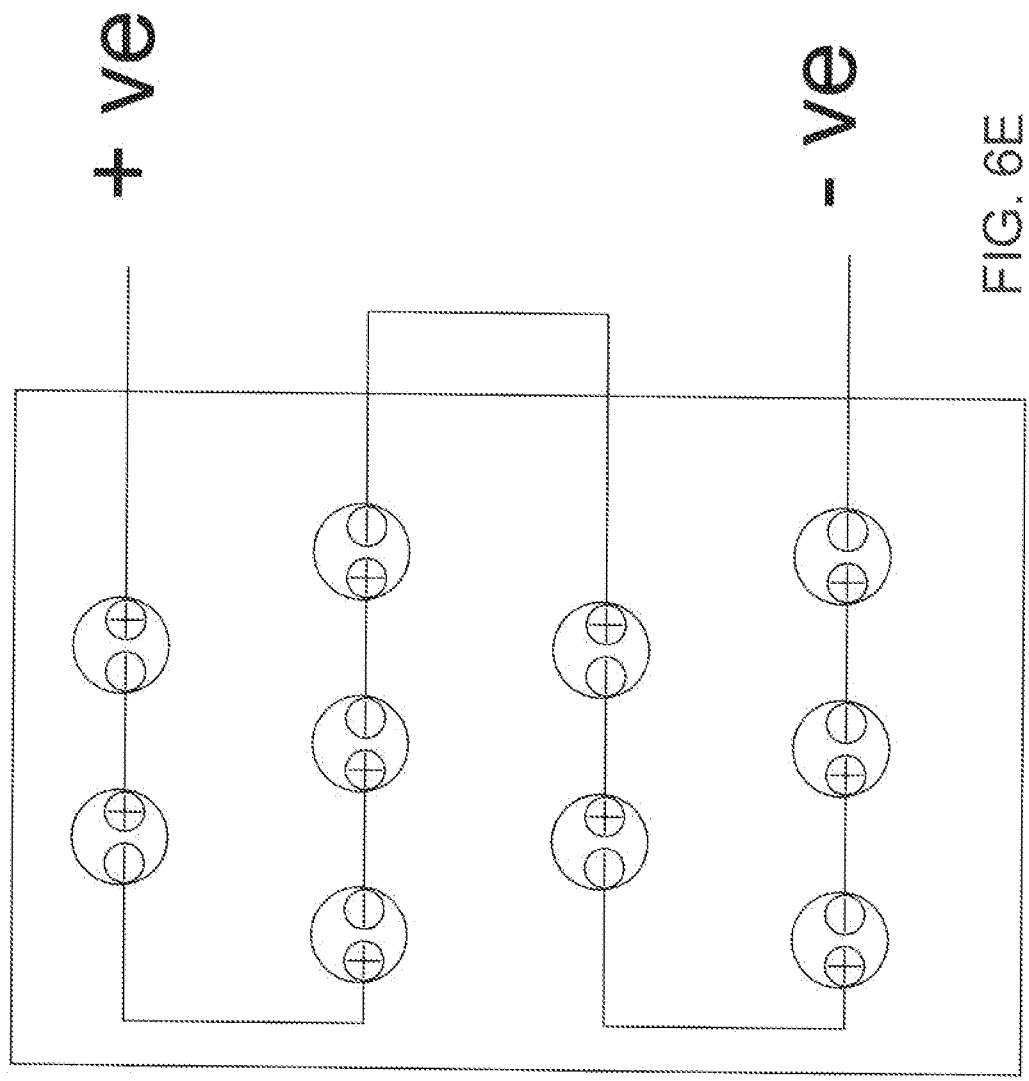

MULTIMODAL RENEWABLE ENERGY

CROSS-REFERENCE TO RELATED APPLICATION

This application is a divisional of and claims priority from U.S. patent application Ser. No. 16/923,905 filed on Jul. 8, 2020 which claims priority to Provisional Patent Application No. 62/875,785 filed on Jul. 18, 2019, the entire disclosure of which is part of the disclosure of the present application and is hereby incorporated by reference in its entirety.

BACKGROUND

The present invention relates to electricity generation and, in particular, to providing a continual source of electricity for an electric or a hybrid vehicle.

Use of renewable energy sources is increasing because of the limited supply of non-renewable energy sources such as coal, petroleum products and other hydrocarbon energy sources. Renewable energy sources are environmentally friendly and practically unlimited in supply.

Photovoltaic systems use solar radiation—both direct and scattered sunlight—to create electrical energy. The basic building blocks of a photovoltaic system are solar/photovoltaic cells. The cells typically consist of semiconductor materials that convert light into electricity. In order to increase power output, a plurality of cells can be interconnected to form panels or modules. The panels are typically flat. Several modules can be installed in a rack to form a photovoltaic array. Photovoltaic systems further include mounting racks and hardware for the panels, wiring for electrical connections, and power conditioning equipment, including inverters and optional batteries for electricity storage. The energy conversion efficiency or ECE ($\eta$) of the cells is the percentage of the incident photon energy in the form of sunlight or any other source of light that is converted to electrical energy. When a photon penetrates a photovoltaic cell, it can produce an electron-hole pair. The pair generated contribute to the current produced by the cell.

Electrical generators convert mechanical energy into electrical energy. Conventional power generation utilizes non-renewable energy sources as sources of mechanical energy. Steam turbines, gas turbines or internal combustion engines convert mechanical energy to generate electricity. Wind turbines convert the wind's kinetic energy into electrical energy. The smallest turbines are used for applications such as battery charging for auxiliary power for boats or powering traffic warning signs.

Electromagnetic induction is the production of voltage or electromotive force due to a change in the magnetic field. When an electric conductor is constantly moving within a static magnetic field, electromagnetic induction can be generated. A stationary magnet and an electric coil revolving around the magnet or vice versa are the principle components of an induction generator.

SUMMARY

The present invention is directed to systems and methods for continually charging a battery of an electric vehicle (EV) or a hybrid vehicle having a gasoline engine and electric motor. Currently, many hybrid or light-duty EVs are configured to complete a range of between 200-300 miles on a single charge. According to the various embodiments discussed herein, the battery range can be increased significantly using a variety of energy sources. The energy sources are configured to facilitate continual electricity generation based on: (i) one or more induction generators positioned around predetermined vehicle parts; (ii) wind energy created by the motion of the vehicle in relation to the surrounding medium, and (iii) solar energy. Similar techniques can also be used in watercrafts and amphibious vehicles, wherein the relative motion between the vehicle and the water can be utilized to continually generate electricity.

The induction generators ("generators") can be configured to be placed on or around predetermined areas under the vehicle and inside the wheels. Wind energy and solar energy can be harvested through a platform on top of the vehicle, over the hood, over the trunk, and even the sides of the vehicle including the footboard.

In one embodiment, in a rear wheel drive vehicle, the power shaft can be configured to be inlaid with a plurality of/multiple magnets and a coil can be wound around the shaft but not touching it and attached to the chassis. Since there is no friction between the magnets and the coil, very little extra energy is utilized, and the energy created can be stored in the battery to increase its range.

In front wheel drive vehicles, the rear wheels are passive and attached to independent suspension. In another embodiment, these rear wheels can be configured to have a novel coil and magnet arrangement wherein multiple magnets attached to the wheel can turn around a fixed coil. As long as there is no contact between the coils and the magnets, the excess energy created can be stored in the battery to increase its range, without significant additional energy used to create it.

In yet another embodiment, a system for continual electrical power generation in a moving vehicle involves harnessing wind energy and solar energy through a platform on top of the vehicle, over the hood, over the trunk, and even the sides of the vehicle including the footboard. In a specific embodiment, a hybrid solar and wind energy generator is provided. The energy generator includes a housing having; a photovoltaic unit arranged along a top surface of the housing; and a multilayer wind energy unit arranged along an inside surface of the base of the housing, wherein a plurality of fan-like devices is arranged along a base of the housing, wherein each device includes one or more blades, and below this is the energy harvesting chamber.

The photovoltaic unit includes a three-dimensional photovoltaic panel. The photovoltaic panel includes a plurality of recesses and a central protrusion. A plurality of photovoltaic cells are arranged along the central protrusion and a plurality of light reflectors are arranged along the side walls, or vice versa.

Each wind energy unit comprises: a fan compartment, a generator box, and a central disk wherein the central disk separates the fan compartment from the generator box; and a base. The fan compartment has: a plurality of slat panels arranged at least along its front end, and wherein each of the slats is oriented such that when the vehicle is moving, incoming air is directed to only one side. In a typical setting the incoming air is directed to the left of the housing so that the fan blades turn clockwise. At the back of the housing there are spring loaded windows which opens proportionate to the speed of the vehicle. On the right side of the housing the windows are mostly open to allow the air to get out after it has rotated the fan blades. The one or more fan blades are affixed to a rotating ring, wherein the rotating ring is arranged above the central disk. A plurality of stationary rods is affixed to the base, and these rods project upwards through the central disk where the fans with the rotating ring turns around this central rod. Electrical coils can be wrapped around each of the stationary rods. A plurality of magnets can be arranged to hang from the rotating ring of the fan chamber in such a way that they surround the coils around the stationary rod in the generator chamber. A first/inner bearing connects the rod to an inside sidewall of the rotating ring. A second/outer bearing connects an outer sidewall of the rotating ring to the central disk. In another embodiment, the upright fan chamber and generator chamber are complemented by a mirror image of an upside down generator chamber and fan chamber. The two generator chambers are contiguous whereas the fan chambers are on top and bottom of the generator chambers.

BRIEF DESCRIPTION OF THE DRAWINGS

FIGS. 2A and 2B illustrate a system for continual electrical power generation for a moving vehicle according to an embodiment.

FIG. 3A illustrates a prior art passive wheel attached to an independent suspension system.

FIGS. 3C-3H illustrate a system for continual electrical power generation for a moving vehicle according to another embodiment.

FIGS. 4A-4C illustrate a system for continual electrical power generation for a moving vehicle according to another embodiment.

FIG. 5 illustrates a system for continual electrical power generation for a moving vehicle according to an embodiment.

FIGS. 6A-6F illustrate a system for continual electrical power generation utilizing a combination of solar and wind energy according to an embodiment.

DETAILED DESCRIPTION

It is to be understood that the figures and descriptions of the various embodiments of the present invention have been simplified to illustrate elements that are relevant for a clear understanding of the various embodiments of the present invention, while eliminating, for purposes of clarity, many other elements found in typical methods and systems for providing electrical energy to a vehicle. However, because such elements are well known in the art, and because they do not facilitate a better understanding of the present invention, a discussion of such elements is not provided herein. The disclosure herein is directed to all such variations and modifications known to those skilled in the art.

According to an embodiment, the system for continual electrical power generation in a moving hybrid or electric vehicle ("system") comprises a generator having a novel coil-and-magnet arrangement around one or more vehicle components/modified components.

Figure 1:
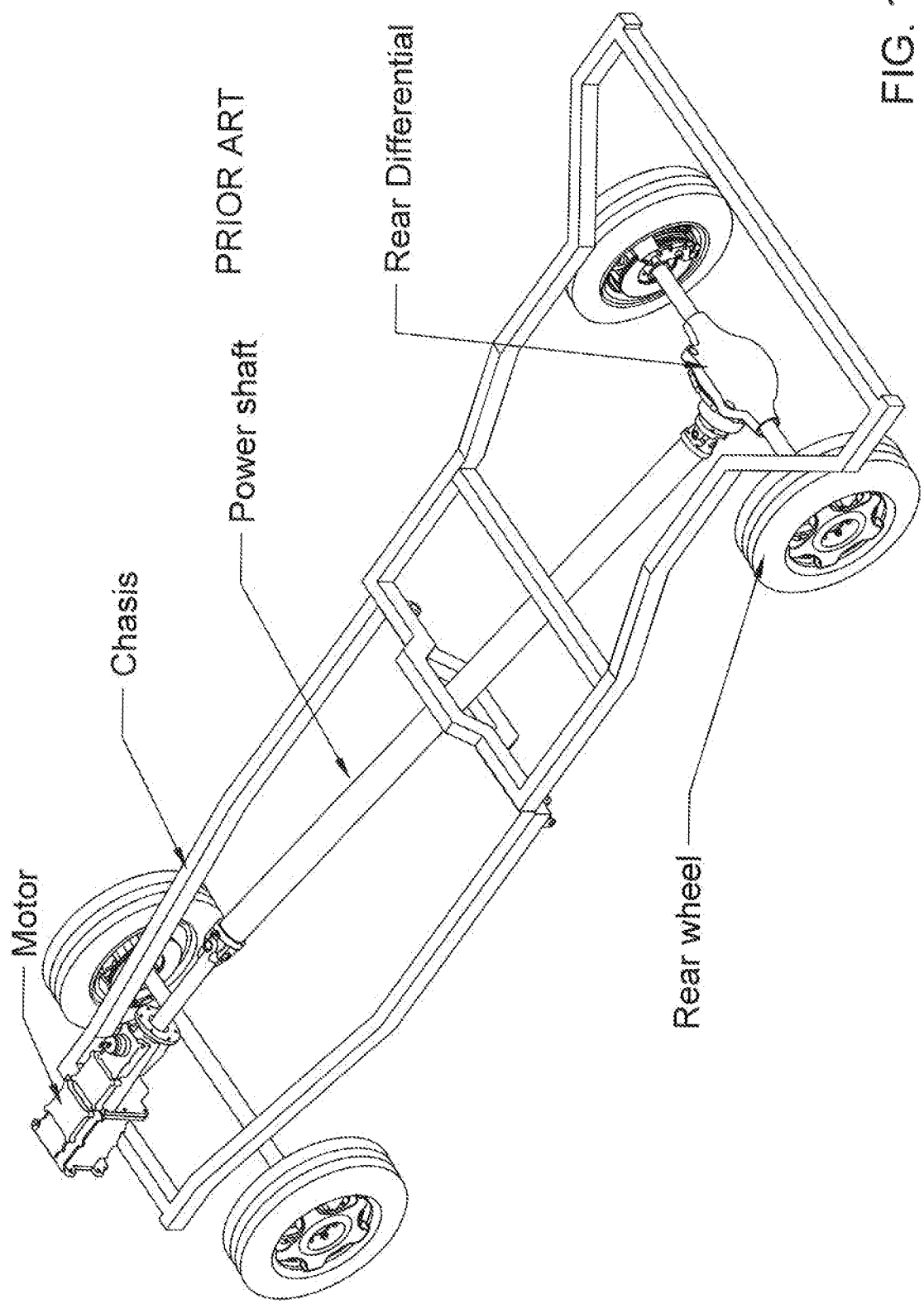
FIG. 1 illustrates a prior art rear wheel drive transmission system.

FIG. 1 is an isometric view of a conventional rear wheel drive transmission system (prior art). In a front-engine rear-wheel-drive car, power generated in the engine is transmitted from the motor through the clutch and the gearbox to the rear axle by means of a power/drive shaft and a rear differential. A drive shaft is configured to transmit torque and rotation. Drive shafts are made of steel, steel alloys, aluminum, composite materials, carbon fiber or combinations of these to withstand effective torque transmission.

Figure 2B:
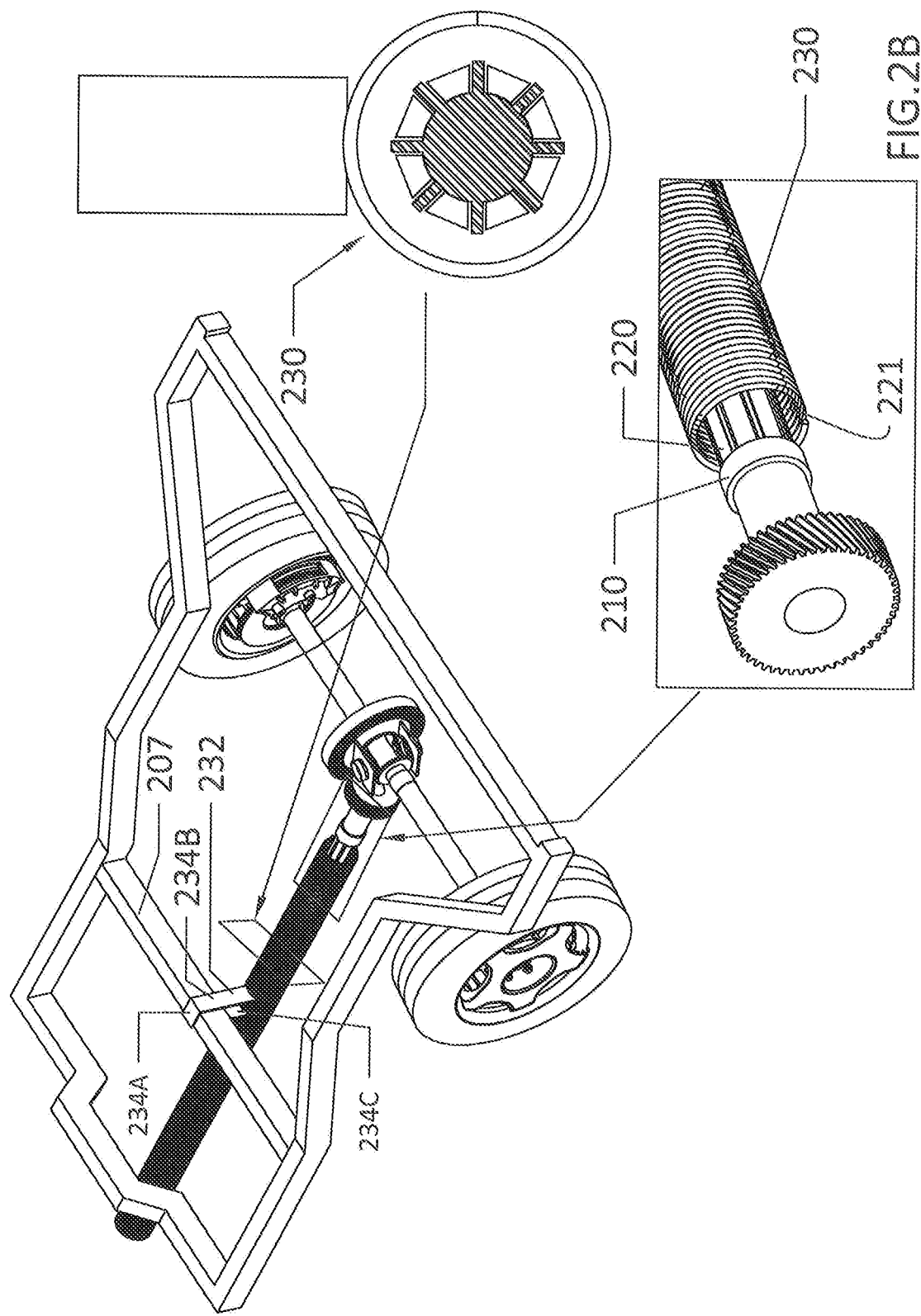

FIGS. 2A and 2B illustrate an embodiment of a system 200 for continual electrical power generation in a moving vehicle. The system 200 involves a novel design for a drive shaft ("power shaft," or "shaft") 210. The drive shaft 210 comprises a generator having a stationary electrical conductor and rotating magnet arrangement. The drive shaft 210 may be a tubular or solid shaft. The outer surface of the shaft 210 includes a plurality of elongated ridges 215. Each ridge 215 partitions the shaft 210 into a plurality of sections or recesses. The recesses between the ridges 215 extend substantially the entire length of the shaft 210. Magnets 220 are embedded/overlaid within the recesses between the ridges 215. The magnets 220 are configured to rotate along with the shaft 210. In an alternate embodiment, elongate strips of magnetic tape having an adhesive back can be surface mounted on the power shaft 210.

An electrical conductor, such as, a wire 230 is substantially wrapped over the length of the shaft 210. The wire 230 is a cylindrical coil. The coil 230 is configured to be separated by an air gap 221 from the magnets on the shaft 210. The air gap 221 between the shaft 210 and the coil 230 can be about 0.3 to 2 mm. The coil 230 can be made of any suitable material, such as, copper. The coil 230 is stationary while the magnets 220 and the shaft 210 are configured to be rotatable. The power generated by magnet 220 and coil 230 will depend on the length and diameter of the drive shaft 210.

The coil 230 can be connected to the chassis 207 by means of a support member 232 to make the coil stationary. The support member 232 includes a body member 234A and two side-arm members 234B, 234C disposed on either side of the body member 234A. The side-arm members 234B, 234C can be configured to extend downward from the chassis 207. The ends of the side-arm members 234B, 234C are positioned between turns of the coil 230.

When the vehicle engine (not shown) is started, the shaft 210 and the magnets 220 are rotated creating the electrical energy between the coil 230 and the magnets 220. This causes the electrons in the coil 230 to move, thereby creating an electric current in the coil 230. The electricity that is generated is configured to be stored in a battery (not shown). The battery can be any conventional battery, such as Lithium ion batteries—used to power EV or hybrid vehicles. This substantially increases the range of the battery. Similar arrangement can be made around any rotating rod including the front and rear axles in the front wheel and the rear wheel drive vehicles respectively.

Figure 3B:
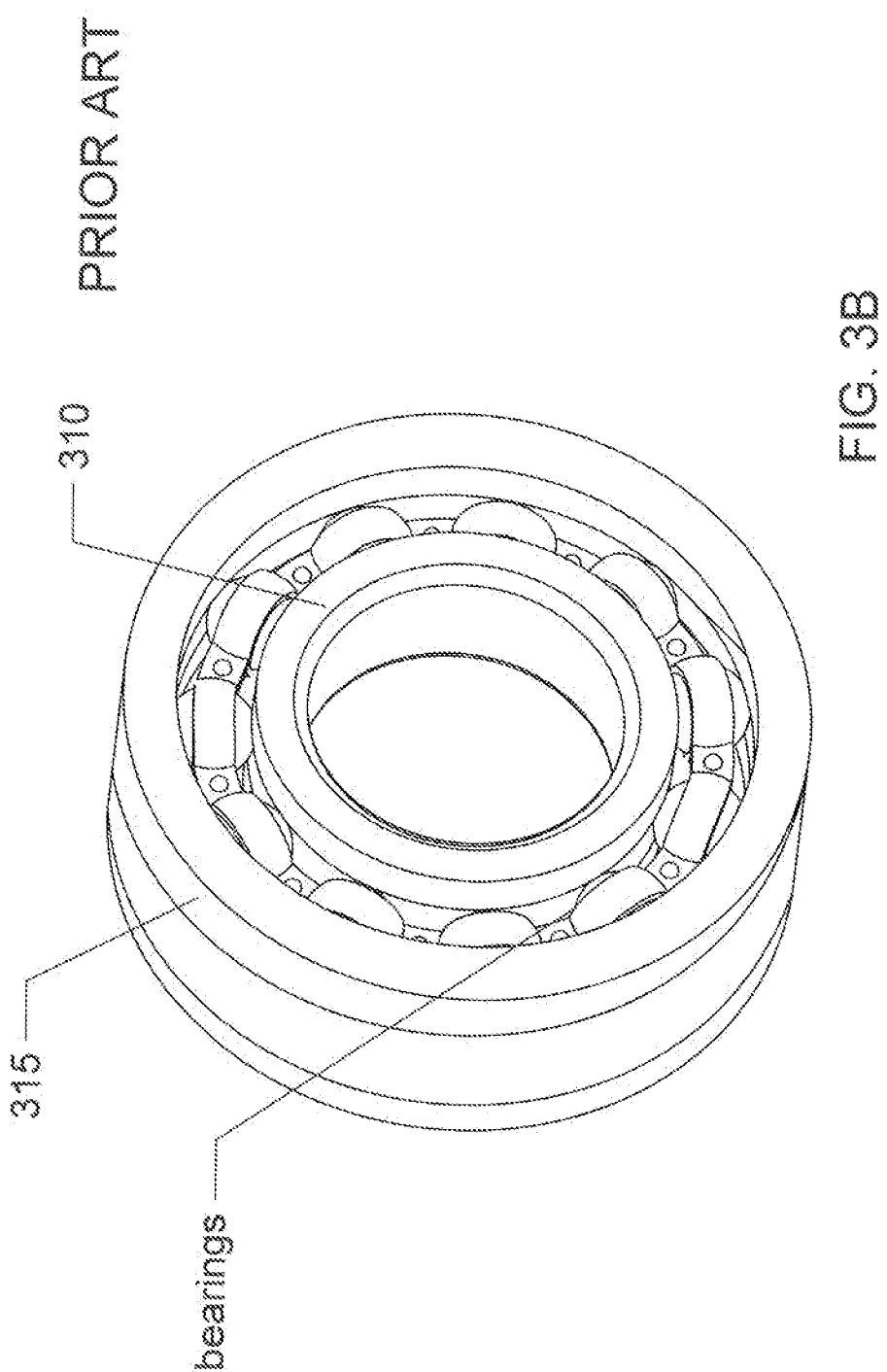
FIG. 3B illustrates a prior art ball bearing cage used on a rear wheel hub.

FIG. 3A illustrates a conventional passive wheel 305 attached to an independent suspension system. Many front wheel drive modern vehicles involve passive rear wheels FIG. 3B illustrates the conventional arrangement of a rear wheel going into independent suspension. The key component is the bearing that connects the wheel to the independent suspension. The bearing includes a set of steel ball bearings which are held together in a metal ring. The bearing includes an outer rotating ring 315 which is attached to the wheel and an inner stationary ring 310 which is attached to the vehicle's independent suspension. The bearings connect the rotating wheels to the stationary suspension.

As described with reference to FIGS. 3C-3H, another embodiment of a system for continual electrical power generation in a moving vehicle is disclosed. The system is the passive wheel 300 and comprises a novel design for the inner stationary ring 310 having a generator with a novel stationary coil and rotating magnet arrangement on the passive wheel 300. The inner stationary ring 310 can be configured with an extension member 320A, 320B (collectively "320"). The extension members 320 are affixed to a central portion of the inner stationary ring 310. The extension members 320 are configured to be non-rotatable. The inner stationary ring 310 and the extension members 320 are non-rotatable. The length of the extension members 320 can be adjustable. For example, it can be around 10 inches-12 inches.

As shown in FIG. 3C, the extension members 320 can include a cylindrical rod member 320A having a substantially hollow interior to eliminate unwanted weight or stress on the vehicle. However, in another embodiment, as shown in FIG. 3D, the extension member can also be a solid rod 320B.

Figure 3E:
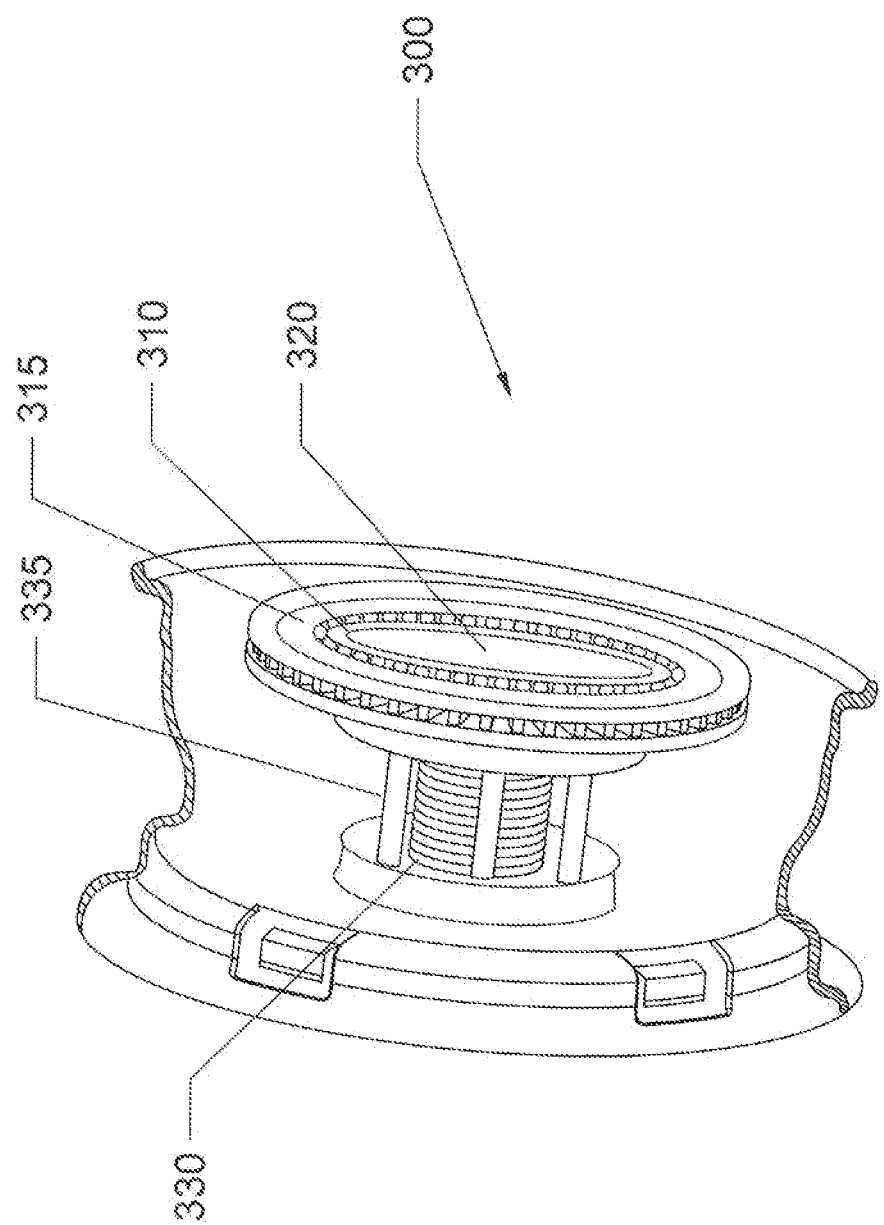

As shown in FIG. 3E, a cylindrical coil 330 can be tightly wrapped around the extension member 320. An array of extended bolts/pins 335 can be positioned around the extension member 320. The extension pins 335 can be made of solid steel or other equally strong material. The extension pins 335 can be configured to connect the passive wheel 300 to the outer rotating ring 315.

Figure 3F:
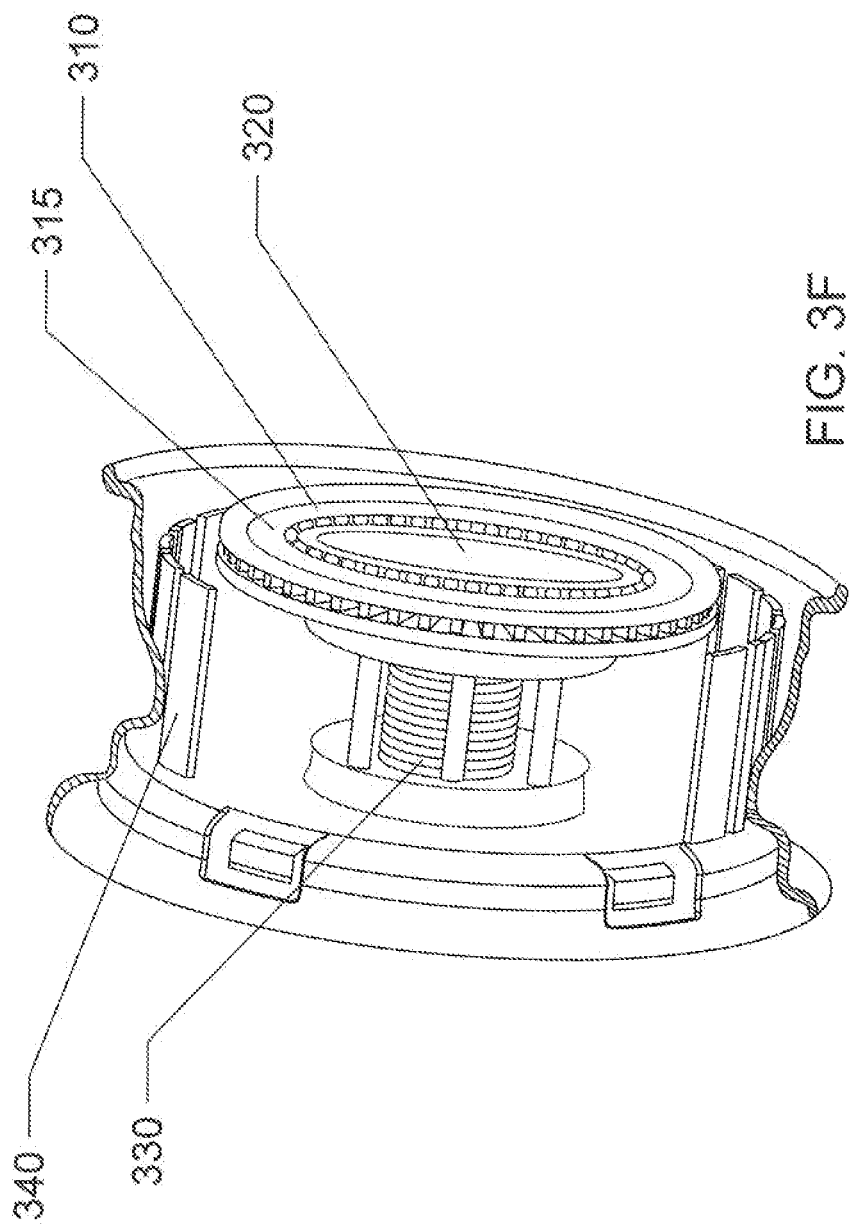
Figure 3G:
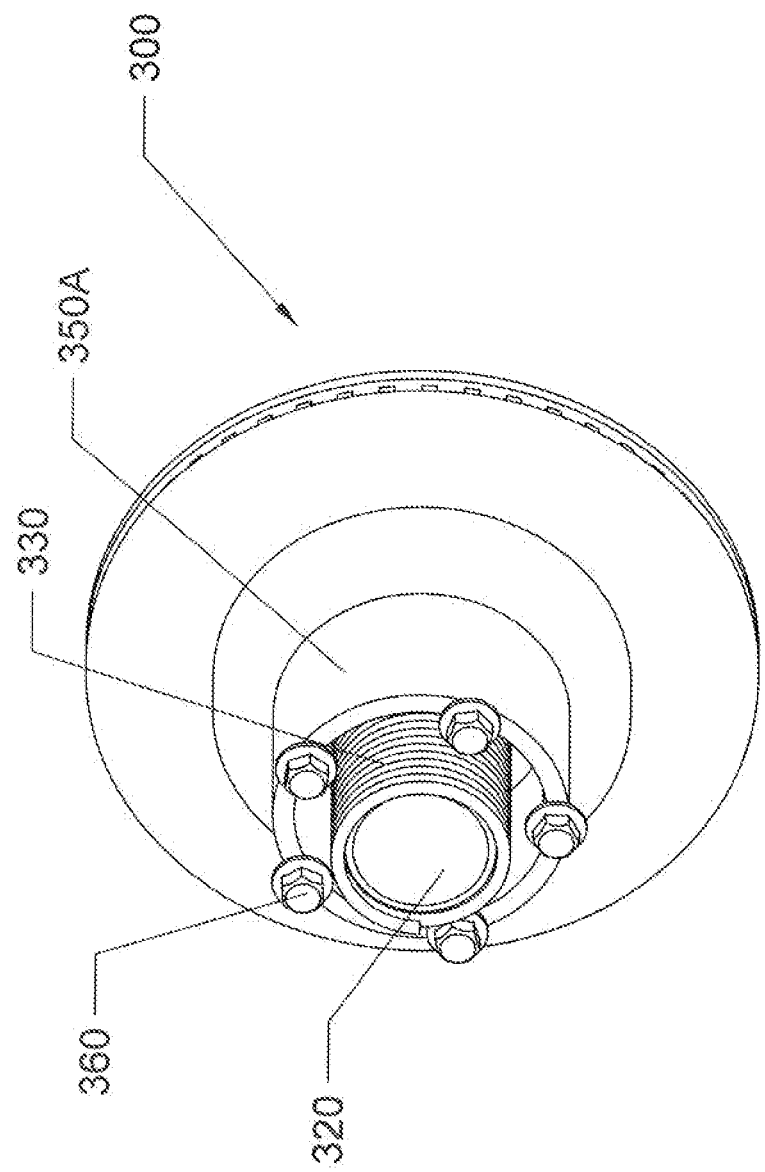
Figure 3H:
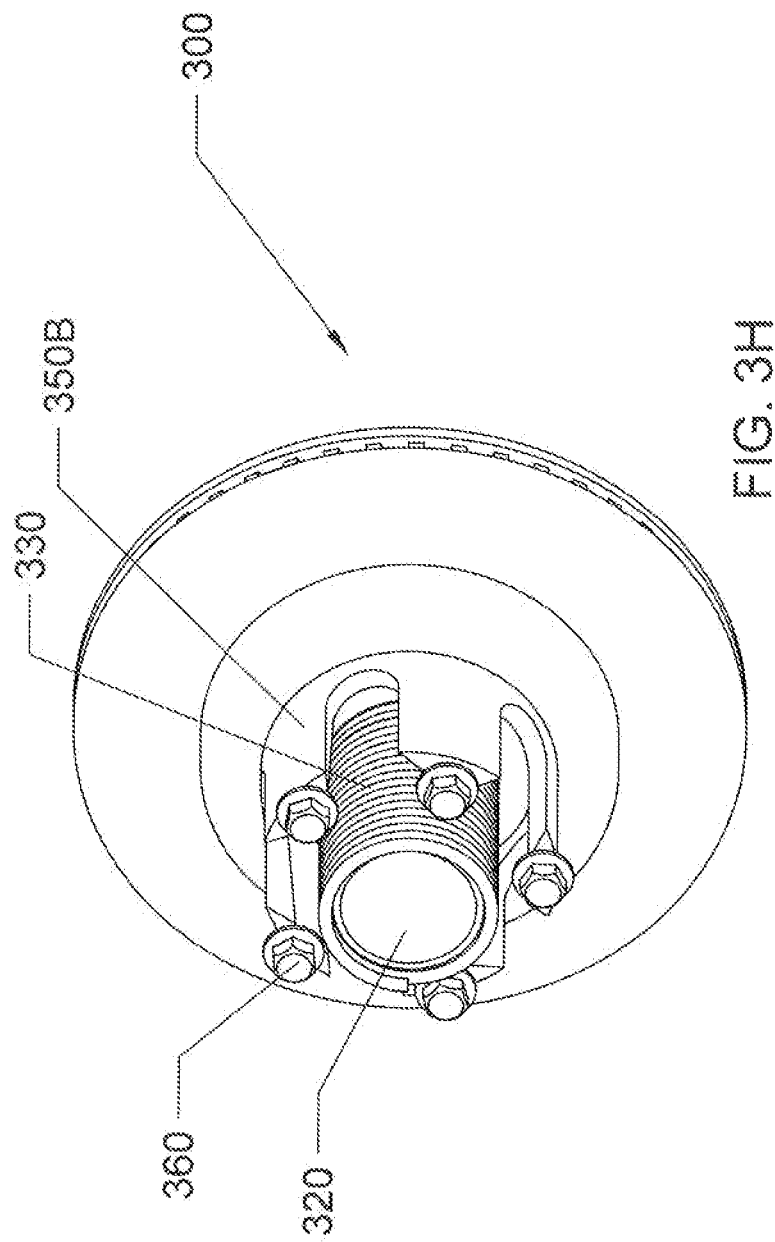

As shown in FIG. 3F, a plurality of magnets 340 can be glued or screwed on to an inner surface of the wheel rim. The plurality of magnets 340 can be arranged such that the magnets encircle the extension member 320 having the cylindrical coil 330 wrapped around it. The magnets 340 are configured to rotate with the wheel 300 around the coil 330 and electricity is generated. The electricity that is generated can be stored in the battery In another embodiment, as shown in FIGS. 3G-3H, in lieu of the aforementioned pins 335, a ring-shaped cylindrical member 350A, 350B (collectively "350") can connect the passive wheel 300 to the rotating ring 315. As shown in FIG. 3G, the cylindrical member 350A can completely enclose the extension member 320 having the cylindrical coil 330 wrapped around it. In an alternate embodiment, as shown in FIG. 3H, the cylindrical member 350B can partially enclose the extension member 320 having the cylindrical coil 330 wrapped around it. The cylindrical member 350B includes a plurality of grooves or cut-outs along the body. The cylindrical member 350A, 350B can be affixed to the wheel 300 with a plurality of fasteners, such as, nuts or bolts 360. The cylindrical member 350A, 350B, with the wheel, can be configured to rotate around the non-rotating extension member 320. The electricity that is generated can be stored in the battery, used to run the motor or both.

Figure 4C:
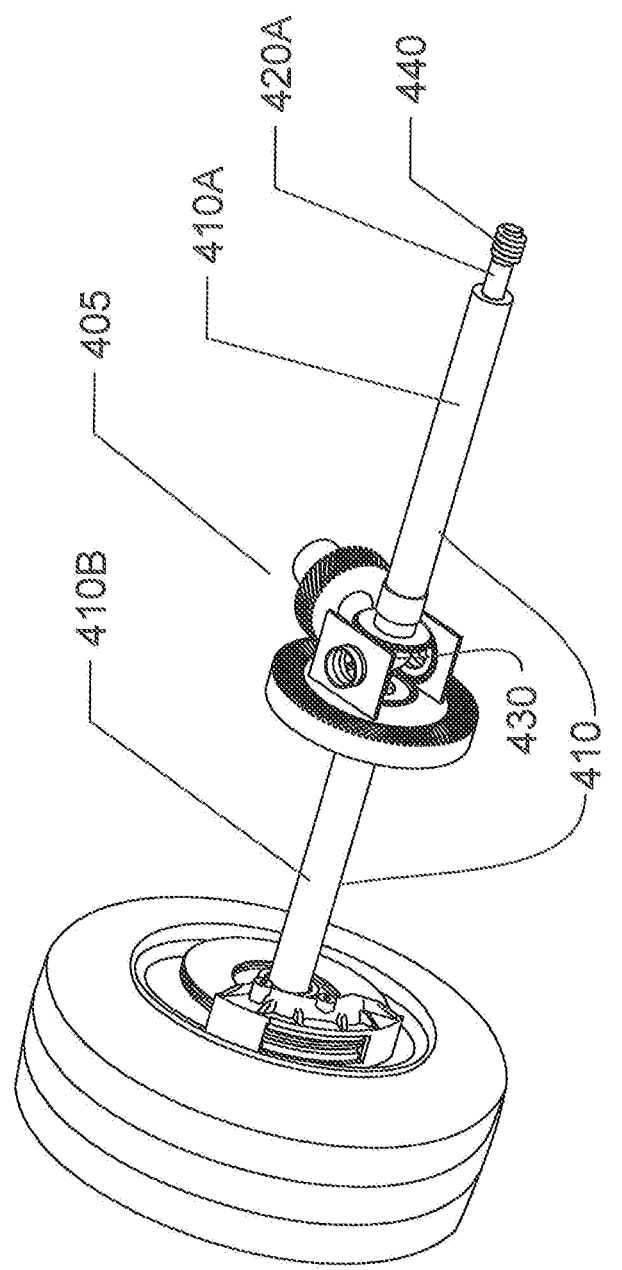

FIGS. 4A-4C illustrate another embodiment of a system 400 for continual electrical power generation for a moving vehicle. The system comprises a novel design for a front axle (active or rotating hollow axle), and a pair of solid extension rod members. The front axle is hollow and capable of being rotated with the front differential. As described, a generator comprising a stationary coil and rotating magnets is provided to generate electricity when the vehicle is in motion. Stationary coil 440 can be attached/coupled to a first end of the extension rod members. A plurality of magnets 340 can be arranged over the stationary coils 440 inside the wheel rims, rotating with the hollow axle. The magnets can be configured to rotate around the stationary coil 440 to generate electricity. The front axle comprises a first cylindrical member 410A and a second cylindrical member 410B. A pair of solid extension rod members 420A, 420B are fitted within either ends of the first cylindrical member 410A and the second cylindrical member 410B. The solid extension rod members 420A, 420B extend beyond the length of the front axle and project beyond the rotating hollow axles 410.

A second end of each solid extension rod members 420A, 420B is securely coupled to a first end of a stem/central rod member that projects outward from either side of a ball-shaped member 430, positioned inside the front differential box 405. The ball-shaped member 430 can be made of a polymeric material. In an embodiment, the ball-shaped member 430 is made of rubber. The ball-shaped member 430 is configured to prevent the solid extension rod members 420A, 420B from rotating inside the first cylindrical member 410A and the second cylindrical member 410B and can allow the turning of the vehicle to the right or left. As shown in FIG. 4C, a coil 440 can be attached to a first end of the stationary solid extension rod members 420A, 420B. The wheel with magnets 340 can be connected to the hollow axle.

FIG. 4B illustrates the solid rods 420A, 420B connected to the ball-shaped member 430 via the stem/central rod member 411 inside the differential box 405. The differential box 405 includes the bases for the rods and the rods screwed into bases from either side. The differential box 405 is configured such that the rods can easily be replaced without opening the differential box 405.

Another embodiment of a system 500 for continual electrical power generation for a moving vehicle is illustrated in FIG. 5. The system 500 comprises a novel design for a drive shaft or the front and back axles in a moving train having a generator comprising a stationary coil-and-rotating magnet arrangement. As shown, magnets 510 can be arranged along the outer surface of the axles 505 of the moving trains connected to the left and right wheels. Cylindrical coils 520 are wrapped over the magnets 510. An air gap separates the coil 520 from the magnets 510. The coils 520 are held in a stationary position by coil support members 511. When the magnets are actuated by the movement of the axles, electricity is generated. The electricity can be stored in the battery, run the motor or both.

Figure 6A:
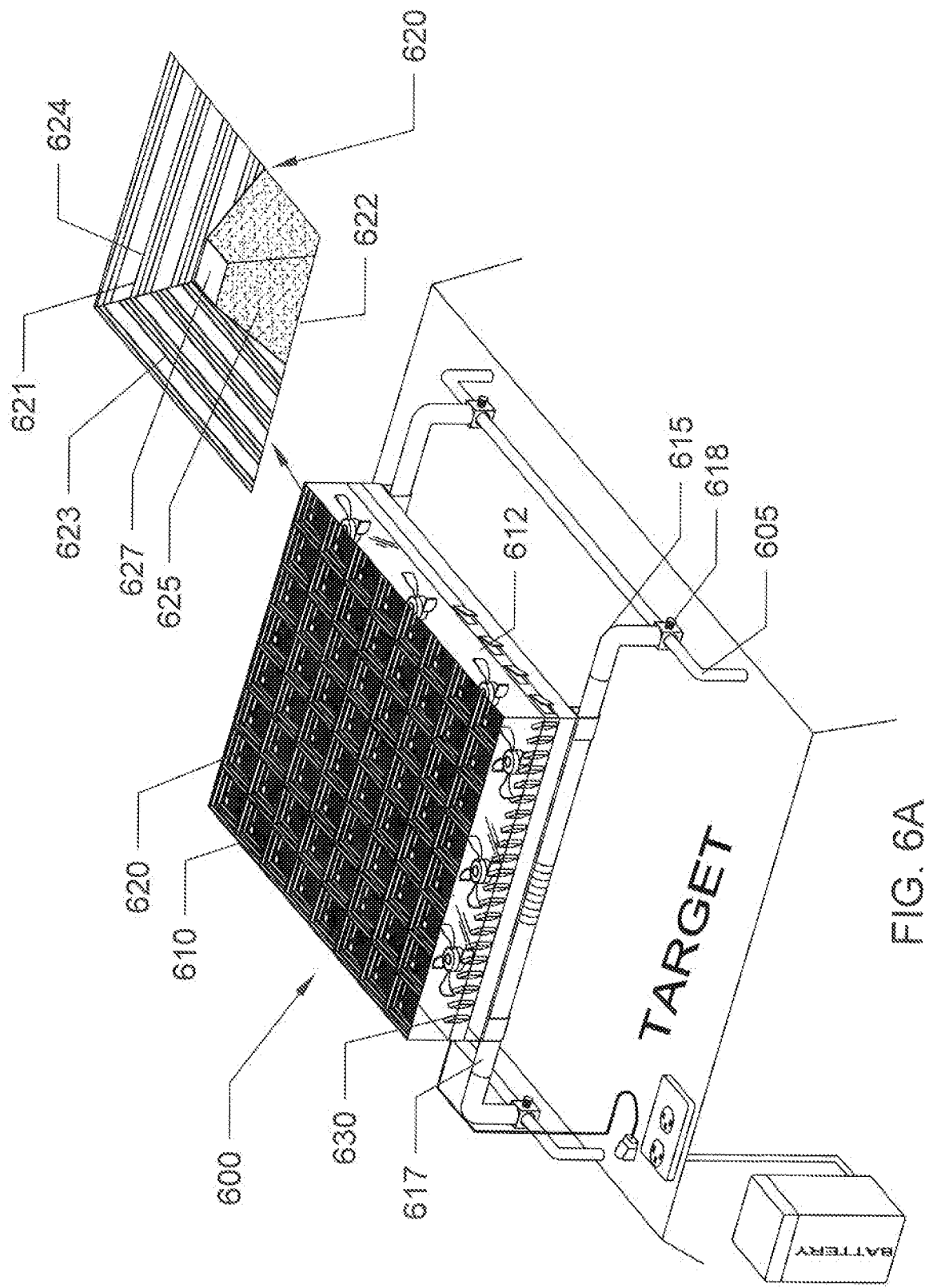

FIGS. 6A-6H illustrate yet another embodiment of a system 600 for continual electrical power generation using one or more renewable energy sources, such as, solar and wind energy. As shown in FIG. 6A, the system 600 includes a hybrid solar and wind energy generator 610 for providing electricity to the battery of the vehicle. The energy generator 610 includes a housing 612. A photovoltaic unit 620 arranged along a top surface of the housing 612. A wind energy unit 630 is arranged along an inside surface of the base of the housing 612. The energy generator 610 is configured to be mounted on a rack 615. The rack 615 includes telescoping attachments 617 that can be attached to a top frame 605 of a vehicle using screws 618 or other fasteners.

The photovoltaic unit 620 includes a conventional or 3-D photovoltaic panel 621. The 3-D panel 621 includes a plurality of recesses 622 and a central protrusion. Each recess 622 has a plurality of photovoltaic/solar cells 623 arranged along its inside sidewalls 624. A substantially conical-shaped protrusion is formed along the center of each recess 622. The sides 625 and top surface 627 of each protrusion can be configured with mirrors or other light reflectors. Alternatively, in another embodiment, the photovoltaic cells 623 can be arranged on the protrusion and the reflectors can be on the sidewalls 624. This arrangement can facilitate an intermittent recycling of light inside the photovoltaic unit 620 to provide a continual source of solar energy for a moving vehicle, as described in Applicant's prior patents, U.S. Pat. Nos. 9,287,428, 10,079,571, 10,097,135 and 10,439,552, all of which are incorporated by reference herein.

Figure 6B:
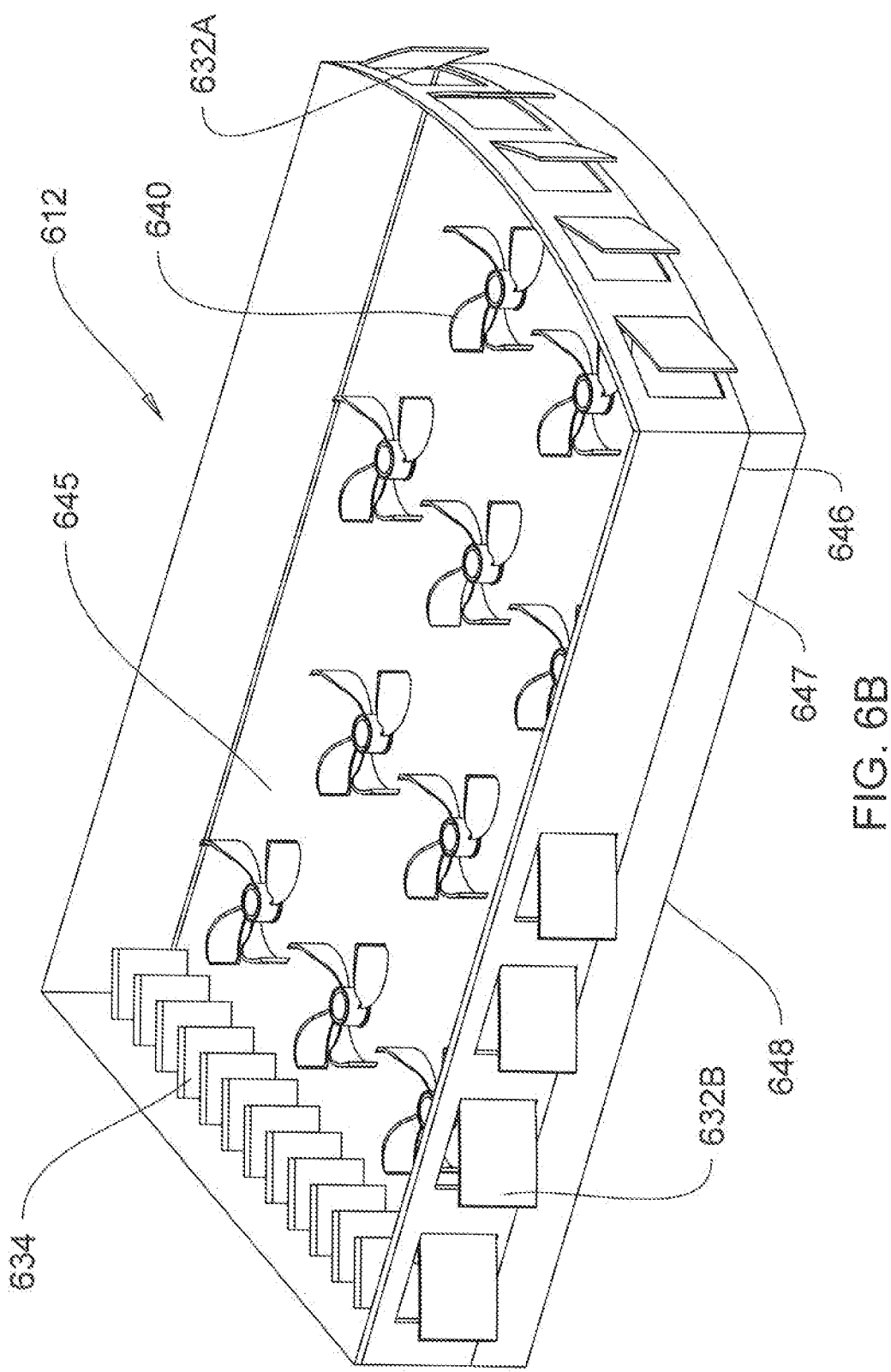
Figure 6C:
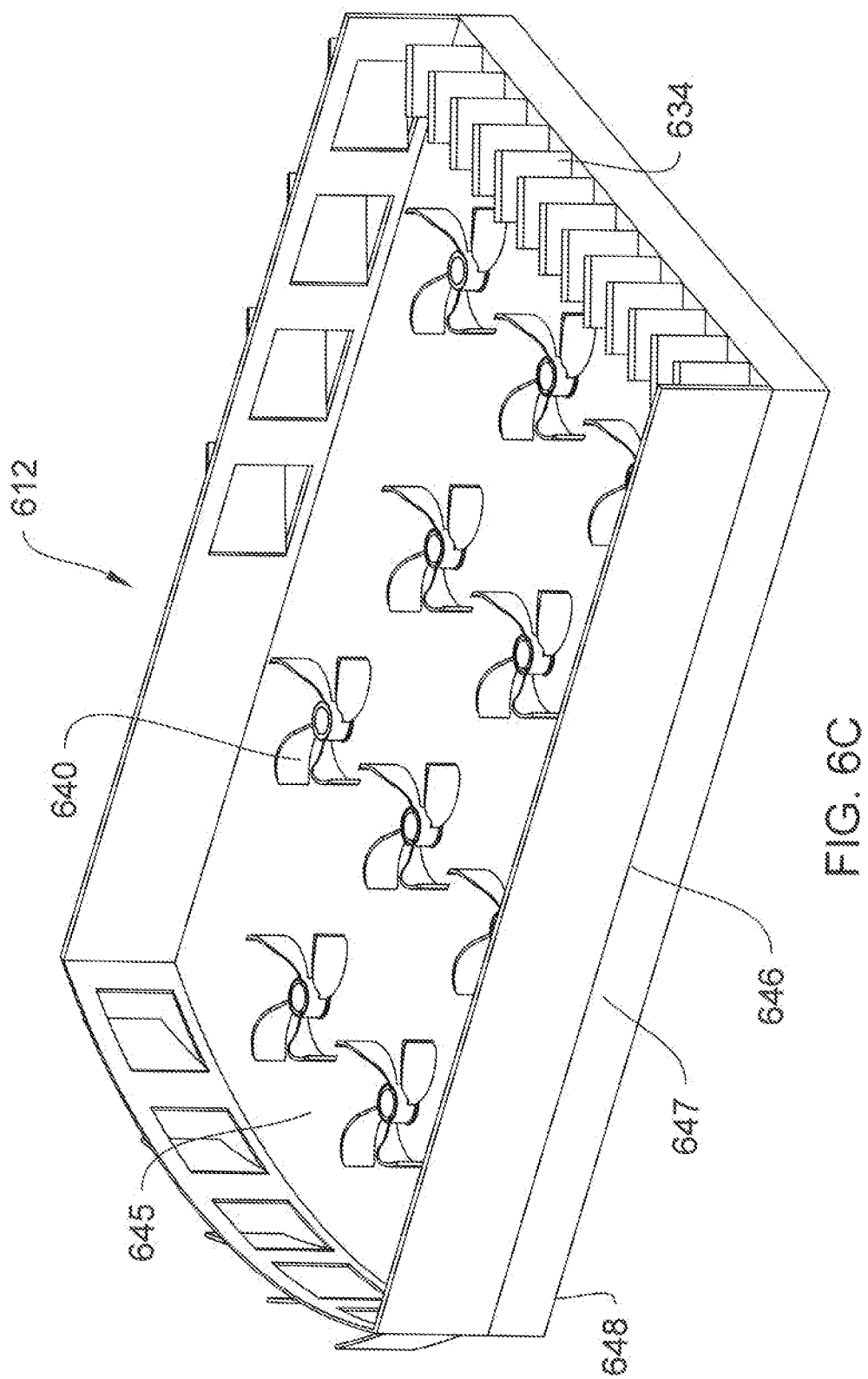

FIGS. 6B-6C illustrate a view of the housing 612 without its top surface. The housing 612 is substantially enclosed on all sides except for its front. The housing 612 includes a plurality of openable panels 632A arranged along its rear end. The panels 632B can be positioned along one sidewall of the housing. In the front wall of the housing 612 there are slats 634. These slats are oriented such that the incoming air is directed to only one side. The panels 632A are spring loaded and configured to be opened under the pressure exerted by air flowing in through the front of the housing unit 612 and directed to the back through one side or the other. As shown in FIG. 6C, the rear end is slightly rounded. When the vehicle is moving slowly, air can recirculate in the housing 612 and the panels 632A remain in a closed position. This can ensure optimal spinning of the blades of the devices 640, and the air finally can get out through 632B. When the vehicle picks up speed, the panels 632A are opened due to the pressure exerted by incoming air. This facilitates the expulsion of just enough air to avoid resistance for the vehicle. The remaining air will get out of the housing 612 through the side panels 632B.

Elongated vertical slats 634 are located along the front of the housing 612. The slats 634 are oriented such that the blades of all the fans 640 can turn either clockwise or anticlockwise due to incoming air. The drawing is to show the air directed to the left so that the fans turn clockwise and the air finally gets out of the right side of the fan box through the side panels 632B.

FIG. 6C represents the entire housing unit 612. It has a top fan compartment 645 and a bottom generator compartment 647 separated by a central disk 646. At the bottom of the generator compartment 647 is the base 648. An array of fan-like devices 640 are fitted within the fan compartment 645. A predetermined number of devices 640 can be arranged in multiple rows. The number of devices 640 in each row can be varied, as needed, to facilitate optimal energy generation. The devices 640 in each row may be separated by a predetermined gap from the devices in an adjacent row. The devices 640 in each adjacent row are arranged such that the devices in a, for example, second row are positioned beneath the gaps in the first row and so on to allow an optimal air flow in the fan compartment 645 of the housing 612.

Figure 6D:
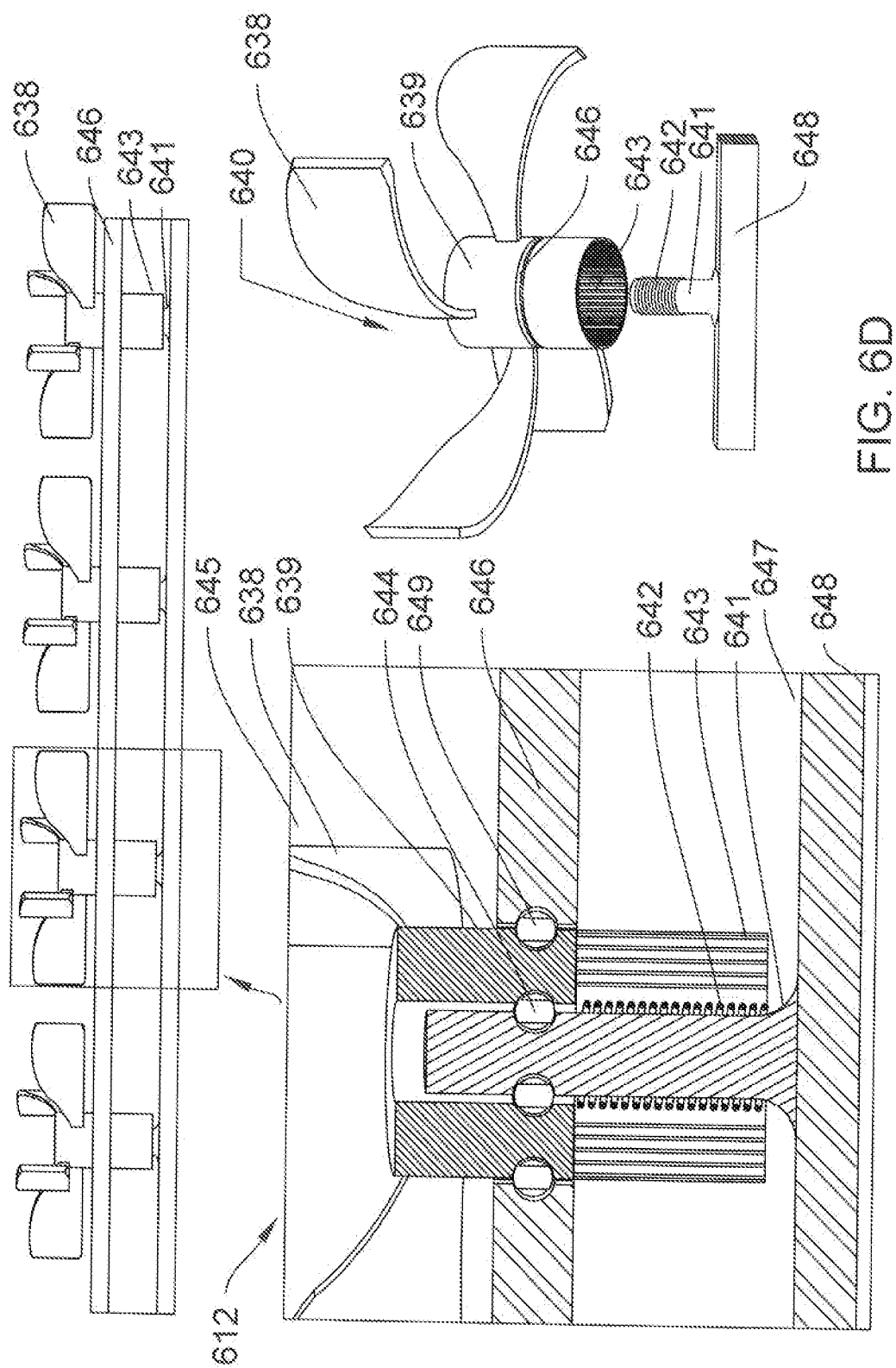

FIG. 6D illustrates a front plane cut view of a device 640 coupled to the base/flooring 648 of the housing 612. The devices 640 are configured to generate electricity utilizing the energy of the incoming air. Each device 640 comprises: a fan compartment 645, a central disk 646, a generator box 647 and a base plate 648. The central disk 646 separates the fan compartment 645 from the generator compartment 647.

The device 640 further includes a plurality of blades 638 affixed to a rotating ring 639. The rotating ring 639 is arranged above the central disk 646. The blades 638 can have any shape. Preferably, the blades 638 are shaped/designed based on the anticipated angle of airflow and upstream and downstream velocity fields.

A plurality of stationary rods 641 are affixed to the base 648, and projects into the fan compartment through the central disk. The fan blades with the rotating ring rotates around this projection of stationary rod from the base through the central disk. One or more electrical coils 642 are wrapped around rods 641. The coils 642 are arranged beneath the central disk 646. A plurality of magnets 643 are arranged hanging from the rotating ring 639, capable of rotating around the central rods 641 with its coil 642. The magnets 643 are configured to revolve around the coil 642.

A first/inner bearing 644 connects the rod 641 to an inside sidewall of the rotating ring 639. This facilitates holding the device 640 in an optimal position thereby facilitating the rotation of the device 640 on the rod 641. It is again noted that rods 641 are configured to be stationary. A second/outer bearing 649 connects an outer sidewall of the rotating ring 639 to the central disk 646. The central disk 646 is configured to absorb the rotational torque and forces on the central disk 646 thereby ensuring the stability of the device 640. The devices 640 are configured to turn smoothly and easily and in one direction only with the incoming air because of the vertical slats 634 arranged along the front of the housing 612 and by a predetermined judicious weight distribution on the fan blades 638.

FIG. 6E illustrates a schematic of how the energy collected in the energy generator 600 is transmitted to a battery (not shown). FIG. 6E illustrates a series connection. However, the connections can be in series, parallel or a combination of the two. The magnet-coil arrangement on the device 640 generates alternating current (AC) which can be converted to direct current (DC) via a bridge diode rectifier. After rectification, they can be connected to the controller either in parallel or series. A parallel connection will source a higher current, while connecting them in series will result in higher voltage.

Figure 6F:
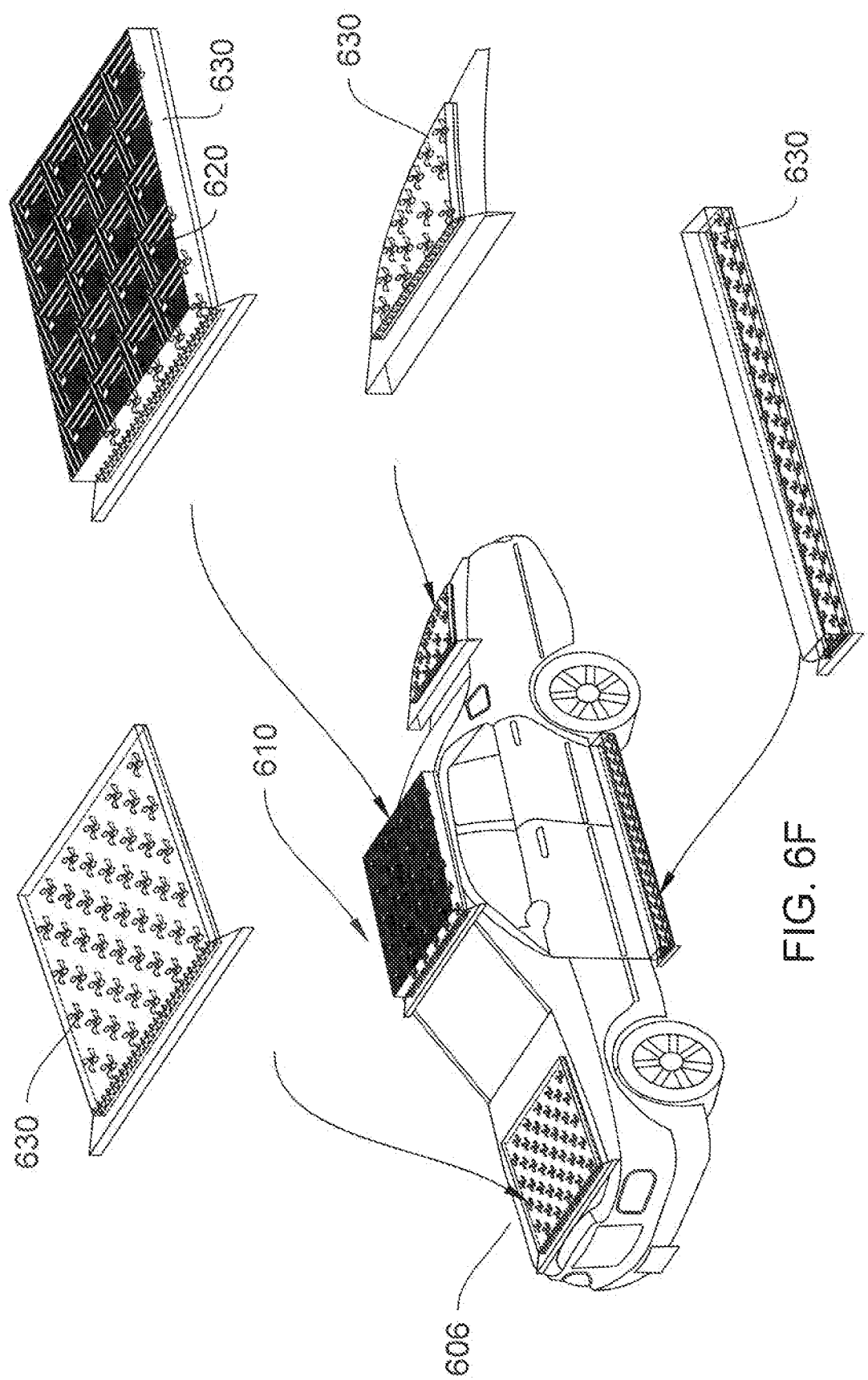

As shown in FIG. 6F, the energy generator 610 comprising either the photovoltaic unit 620 and/or the wind energy unit 630 can be arranged along the roof, on top of the hood, on top of the trunk, side and/or under the footboard or any other feasible open area of vehicle 606.

Figure 7A:
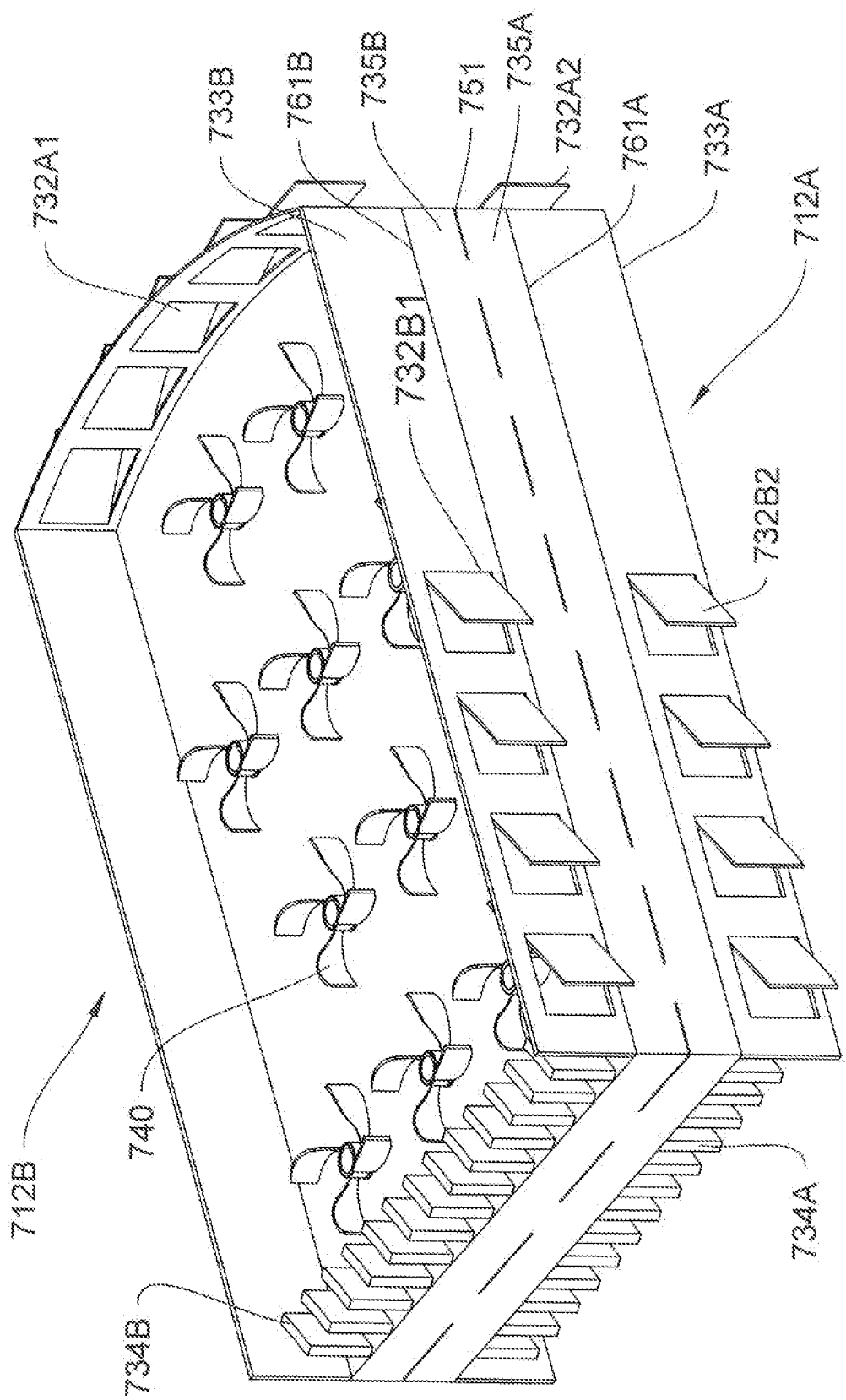
FIG. 7A illustrates a wind energy unit according to an embodiment.
Figure 7B:
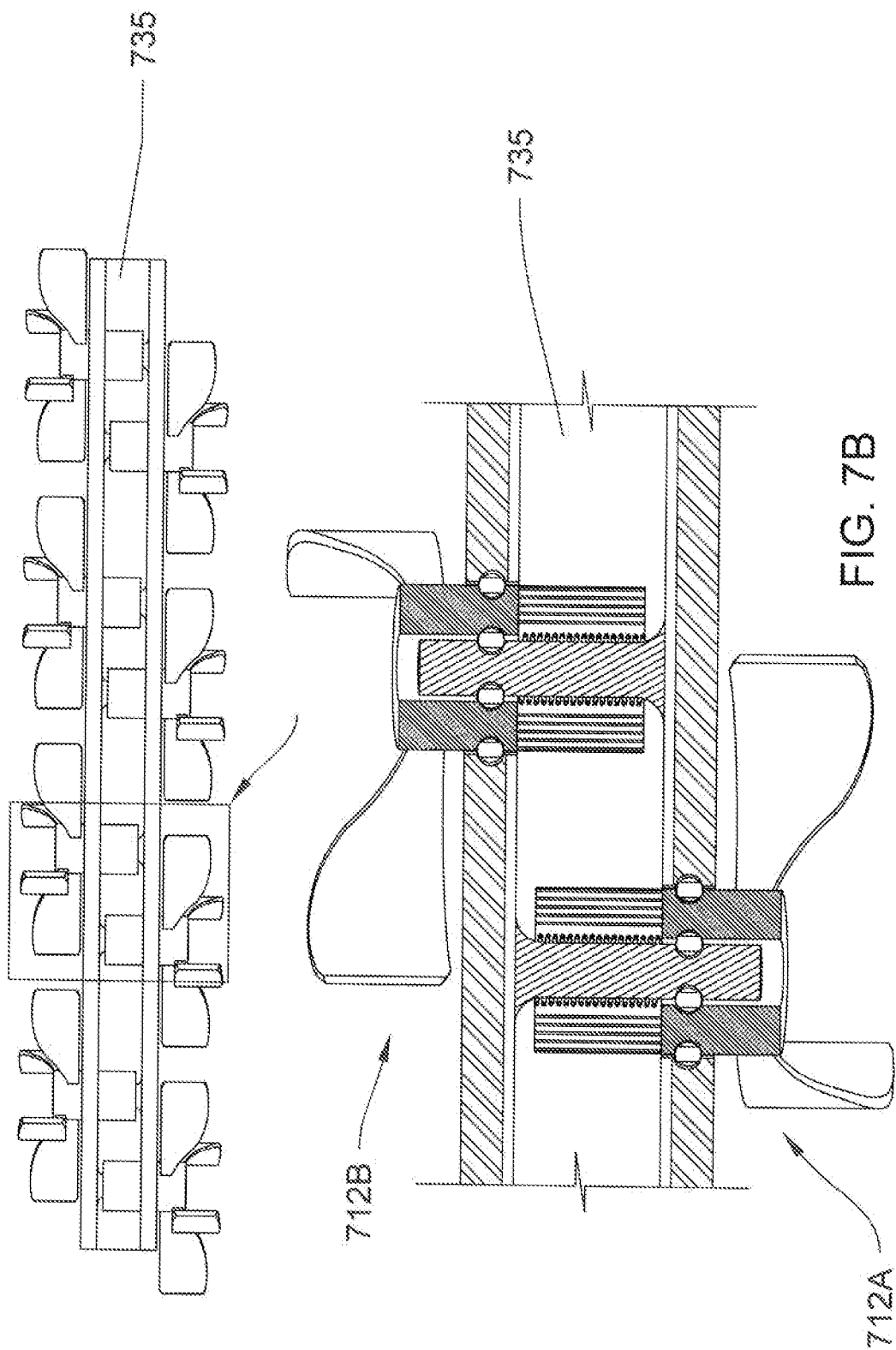
FIG. 7B illustrates a front plane section cut view of the wind energy unit according to an embodiment.
Figure 7C:
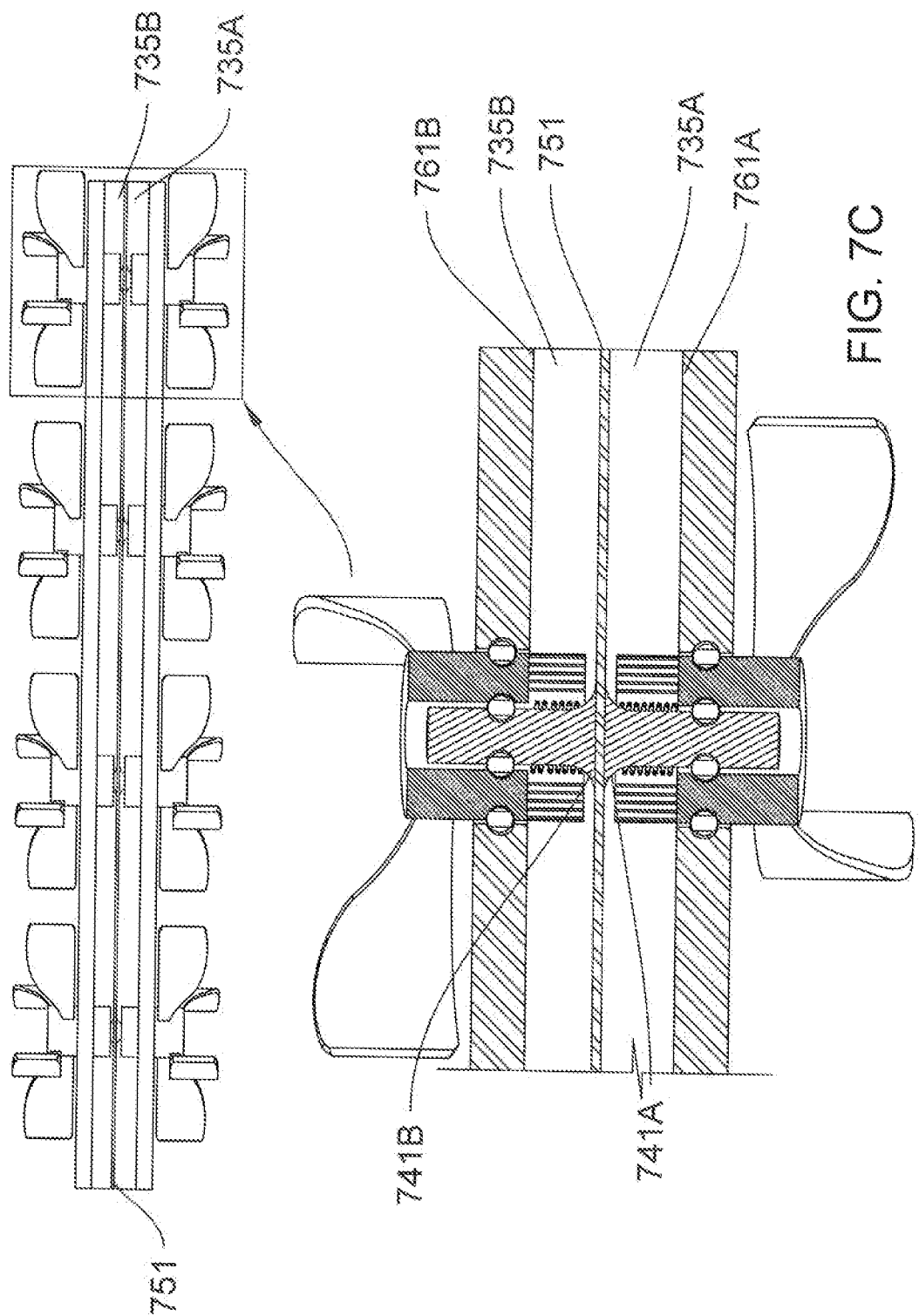
FIG. 7C illustrates a front plane section cut view of the wind energy unit according to another embodiment.

FIGS. 7A-7C illustrates another embodiment of the wind energy unit. Unlike the aforementioned wind energy unit 630, the wind energy unit in this embodiment includes a two-tiered arrangement. In this arrangement, a first tier housing 712A includes a plurality of panels 732A2 arranged along its rear end and a plurality of panels 732B2 arranged along a first side 733A of housing 712A. Slanting vertical slats 734A are arranged along the front of the first tier housing 712A. A second tier housing 712B is arranged above the first tier 712A. The second tier 712B includes a plurality of panels 732A1 arranged along a rear end and a plurality of panels 732B1 arranged along a first side 733B of housing 712B. Slanting vertical slats 734B are arranged along the front of the housing 712B. A plurality of devices 740 having rotating blades can be arranged inside the fan compartment of the first and second tiers 712A, 712B. In between the first and second tier housings 712A and 712B are the generator compartments 735A, 735B.

FIGS. 7B-7C illustrates front plane section cut views of wind generator. It is noted that the various components of the devices 740 are like those illustrated and described earlier with reference to FIG. 6D. As illustrated in FIG. 7B, the devices 740 can be positioned in an opposing orientation within the first tier housing 712A and the second tier housing 712B at a predetermined offset distance so that compartment 735 can be shared by the housings 712A, 712B.

In another embodiment, as shown in FIG. 7C, the devices 740 can be positioned in an opposing/offset orientation within the first tier housing 712A and the second tier housing 712B but without any offset distance (as shown in FIG. 7B). The stationary rods 741A and 741B are affixed to a common base plate 751 similar to the base plate 648 of the previous embodiment. The base plate 751 separates adjacent compartments 735A and 735B. The central plate 646 in FIG. 6D will be similar to the central plates 761A, 761B in this arrangement.

Figure 8:
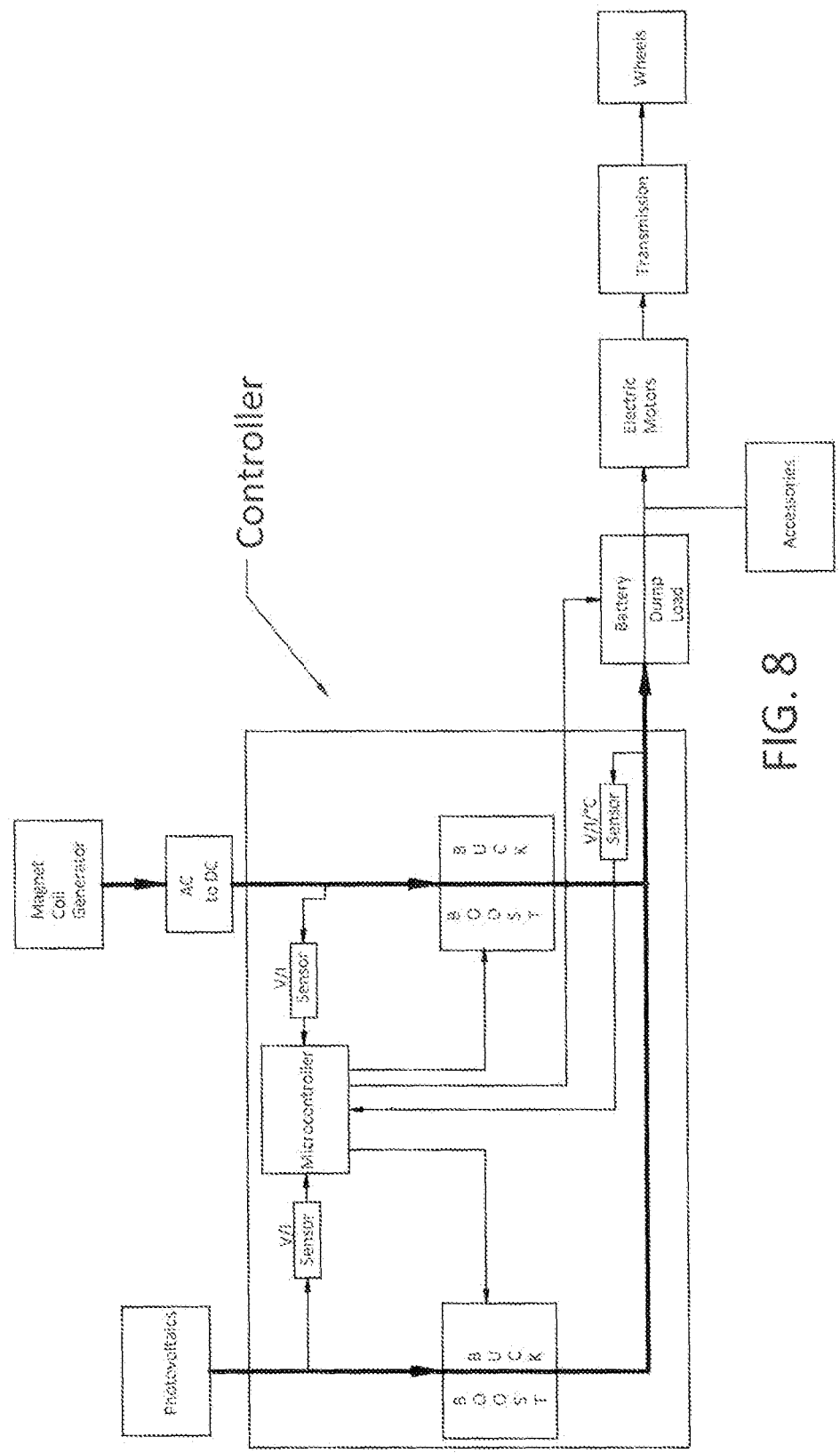
FIG. 8 illustrates an energy flow block diagram according to an embodiment.

FIG. 8 illustrates a block diagram of the energy flowing through various components of the various embodiments of the system for generating continual energy discussed herein. The photovoltaic cells (as discussed with reference to FIG. 6A) are connected directly to a controller. The various stationary coils and rotatable magnet arrangements, as described herein, are connected to the controller via bridge diode rectifiers. The controller has a microcontroller which, using sensors, monitors incoming and outgoing power generated to transfer it to a battery system. The sensors can also monitor the photovoltaic cells, magnet-coil arrangements and battery to ensure that they function at a desired range of voltage, current and temperature. When power is supplied to the controller, a voltage regulator system maintains a set voltage level using a DC-DC converter such as a buck or boost converter and a current regulator to keep the supplied current constant. Once the battery approaches a set voltage, indicating the battery is full, the charge controller turns on a dump load. A dump load is also necessary in order to redirect extra electricity away from the battery. The dump load can take the extra energy and transformed it into thermal energy. To prevent the heat from radiating inside the car, the dump load can be positioned outside the car with a cooling fan system/liquid cooling system, or outside wind.

Part of electricity generated in the various embodiments disclosed herein is dependent on the energy needed for running the vehicle. Additional renewable energy production is based on factors that do not depend on the energy needed to run the vehicle. For instance, solar energy is independent of the energy needed to run the vehicle. The wind energy discussed above is also independent of the energy needed to run the vehicle. Therefore, the embodiments of the present invention can utilize the relative motion between the vehicle and the surrounding atmosphere to generate a continual source of electricity for the vehicle.

The following description presents several preferred embodiments of the present invention in sufficient detail such that those skilled in the art can make and use the invention. As used herein, the words "comprise," "have," "include," and all grammatical variations thereof are each intended to have an open, non-limiting meaning that does not exclude additional elements or steps.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular illustrative embodiments disclosed above may be altered or modified and all such variations are considered within the scope and spirit of the present invention.

The invention claimed is:

1. A system for continual electrical power generation in a moving vehicle, comprising:
    (A) a generator, the generator having a stationary electrical coil and a plurality of rotating magnets; and
    (B) one or more vehicle components, wherein the electrical coil and the magnets are arranged along the one or more vehicle components to generate electricity, wherein the one or more vehicle components comprises:
        (i) a modified drive shaft or a front and back axle, wherein the plurality of the magnets is overlaid on the drive shaft or the front and back axles, wherein the stationary electrical coil is wrapped over the drive shaft or the front and back axles; and
        (ii) an outer bearing cage for a passive rear wheel, wherein the bearing cage comprises a modified inner stationary ring attached an independent suspension of the vehicle, wherein the modified inner stationary ring comprises a non-rotatable extension member, wherein the electrical coil is wrapped around the extension member, and wherein the plurality of magnets is arranged such that the magnets encircle the extension member.

2. The system according to claim 1, wherein an outer surface of the drive shaft or the front and back axles comprises a plurality of elongated recesses, and wherein the recesses extend the length of the drive shaft.

3. The system according to claim 2, wherein the magnets are embedded within the recesses.

4. The system according to claim 1, wherein there is an air gap between the electrical coil and the magnets overlaid on the drive shaft or the front and back axles.

5. The system according to claim 4, wherein the stationary electrical coil is configured to be stationary while the magnets are configured to rotate with the drive shaft or the front and back axles.

6. The system according to claim 1, wherein the extension member is affixed to a central portion of the inner stationary ring.

7. The system according to claim 6, wherein the extension member comprises at least one of a solid rod member or a hollow rod member.

8. The system according to claim 7, further comprising at least one of: (i) an array of bolts positioned around the extension member, wherein the bolts are configured to connect a passive wheel to a rotor; or (ii) a ring-shaped cylindrical member, wherein the ring-shaped cylindrical member is configured to connect a passive wheel to a rotor.

9. A system for continual electrical power generation in a moving vehicle, comprising:
    (A) a generator, the generator having a stationary electrical coil and a plurality of rotating magnets; and
    (B) one or more vehicle components, wherein the electrical coil and the magnets are arranged along the one or more vehicle components to generate electricity, wherein the one or more vehicle components comprises:
        (i) a modified drive shaft, wherein the plurality of the magnets is overlaid on the drive shaft, wherein the stationary electrical coil is wrapped over the drive shaft; and
        (ii) a modified hollow front axle, wherein the modified front axle includes:
            (1) a first cylindrical member and a second cylindrical member, and
            (2) a first solid extension rod member fitted within the first cylindrical member and a second solid extension rod member fitted within the second cylindrical member, wherein the stationary electrical coil is attached to a first end of each of the first and second extension rod members, and wherein the plurality of magnets is arranged over the stationary electrical coils.

10. The system according to claim 9, wherein an outer surface of the drive shaft comprises a plurality of elongated recesses, and wherein the recesses extend the length of the drive shaft.

11. The system according to claim 10, wherein the magnets are embedded within the recesses.

12. The system according to claim 9, wherein there is an air gap between the electrical coil and the magnets overlaid on the drive shaft.

13. The system according to claim 12, wherein the stationary electrical coil is configured to be stationary while the magnets are configured to rotate with the drive shaft.

14. The system according to claim 9, wherein a second end of the first and second extension rod members are securely coupled to a first end of a central rod member, wherein the central rod member projects outward from a ball-shaped member.

15. The system according to claim 14, wherein the ball-shaped member is configured to prevent the first and second extension rod members from rotating inside the first cylindrical member and the second cylindrical member respectively.

* * * * *